US010367003B2

United States Patent
Kang et al.

(10) Patent No.: US 10,367,003 B2
(45) Date of Patent: Jul. 30, 2019

(54) VERTICAL NON-VOLATILE MEMORY DEVICE AND METHOD FOR FABRICATING THE SAME

(71) Applicant: SAMSUNG ELECTRONICS CO., LTD., Suwon-si, Gyeonggi-do (KR)

(72) Inventors: Shin-hwan Kang, Seoul (KR); Heon-kyu Lee, Hwaseong-si (KR); Kohji Kanamori, Seoul (KR); Jae-duk Lee, Seongnam-si (KR); Jae-hoon Jang, Seongnam-si (KR); Kwang-soo Kim, Hwaseong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/485,579

(22) Filed: Apr. 12, 2017

(65) Prior Publication Data
US 2017/0365616 A1 Dec. 21, 2017

(30) Foreign Application Priority Data

Jun. 20, 2016 (KR) .................. 10-2016-0076838

(51) Int. Cl.
*H01L 31/112* (2006.01)
*H01L 31/036* (2006.01)
(Continued)

(52) U.S. Cl.
CPC .. *H01L 27/11582* (2013.01); *H01L 21/76816* (2013.01); *H01L 21/76877* (2013.01); *H01L 23/528* (2013.01); *H01L 23/5226* (2013.01); *H01L 23/53271* (2013.01); *H01L 27/1157* (2013.01); *H01L 27/11524* (2013.01); *H01L 27/11556* (2013.01); *H01L 27/11573* (2013.01); *H01L 29/04* (2013.01); *H01L 29/16* (2013.01)

(58) Field of Classification Search
CPC ......... H01L 27/11582; H01L 27/11573; H01L 27/11524; H01L 27/1157; H01L 21/76816; H01L 23/528; H01L 21/76877; H01L 23/5226; H01L 29/04; H01L 27/11556; H01L 29/16; H01L 23/53271
See application file for complete search history.

(56) References Cited

U.S. PATENT DOCUMENTS 8,759,895 B2  6/2014  Tang et al.
8,803,214 B2  8/2014  Tang et al.
(Continued)

*Primary Examiner* — Ismail A Muse
(74) *Attorney, Agent, or Firm* — Lee & Morse, P.C.

(57) ABSTRACT

A vertical non-volatile memory device includes a substrate including a cell region; a lower insulating layer on the substrate; a lower wiring pattern in the cell region having a predetermined pattern and connected to the substrate through the lower insulating layer; and a plurality of vertical channel layers extending in a vertical direction with respect to a top surface of the substrate in the cell region, spaced apart from one another in a horizontal direction with respect to the top surface of the substrate, and electrically connected to the lower wiring pattern. The memory device also includes a plurality of gate electrodes stacked alternately with interlayer insulating layers in the cell region in the vertical direction along a side wall of a vertical channel layer and formed to extend in a first direction along the horizontal direction.

20 Claims, 46 Drawing Sheets

(51) Int. Cl.

| | |
|---|---|
| H01L 29/76 | (2006.01) |
| H01L 29/10 | (2006.01) |
| H01L 27/11582 | (2017.01) |
| H01L 21/768 | (2006.01) |
| H01L 23/522 | (2006.01) |
| H01L 23/528 | (2006.01) |
| H01L 23/532 | (2006.01) |
| H01L 27/11524 | (2017.01) |
| H01L 27/11556 | (2017.01) |
| H01L 27/1157 | (2017.01) |
| H01L 29/04 | (2006.01) |
| H01L 29/16 | (2006.01) |
| H01L 27/11573 | (2017.01) |

(56) References Cited

U.S. PATENT DOCUMENTS

| | | | |
|---|---|---|---|
| 9,208,883 B2 | 12/2015 | Alsmeier | |
| 9,209,031 B2 | 12/2015 | Baenninger et al. | |
| 9,231,117 B2 | 1/2016 | Tang et al. | |
| 2012/0112264 A1* | 5/2012 | Lee | H01L 27/11551 257/324 |
| 2013/0134492 A1* | 5/2013 | Yang | H01L 27/1157 257/314 |
| 2014/0054673 A1* | 2/2014 | Kim | H01L 29/792 257/324 |
| 2015/0179660 A1 | 6/2015 | Yada et al. | |
| 2015/0221667 A1 | 8/2015 | Fukuzumi et al. | |
| 2015/0380428 A1 | 12/2015 | Matsuda | |
| 2017/0084624 A1 | 3/2017 | Lee et al. | |
| 2017/0084696 A1 | 3/2017 | Lee et al. | |
| 2017/0110471 A1* | 4/2017 | Yoshimizu | H01L 27/11582 |
| 2017/0148811 A1* | 5/2017 | Zhang | H01L 27/11575 |
| 2017/0294445 A1* | 10/2017 | Son | H01L 29/7827 |
| 2017/0373089 A1* | 12/2017 | Kim | H01L 27/11582 |

* cited by examiner

VERTICAL NON-VOLATILE MEMORY DEVICE AND METHOD FOR FABRICATING THE SAME

CROSS-REFERENCE TO RELATED APPLICATION

Korean Patent Application No. 10-2016-0076838, filed on Jun. 20, 2016, and entitled, "Vertical Non-Volatile Memory Device and Method for Fabricating the Same," is incorporated by reference herein in its entirety.

BACKGROUND

1. Field

One or more embodiments described herein relate to a vertical non-volatile memory device and a method for fabricating a vertical non-volatile memory device.

2. Description of the Related Art

A variety of semiconductor memory devices have been developed. Examples include volatile memories (e.g., a dynamic random access memory and a static random access memory) and non-volatile memories (e.g., an electrically erasable programmable read-only memory, a ferroelectric random access memory, a magneto-resistive random access memory, and a flash memory). MP3 players, digital cameras, mobile phones, camcorders, flash cards, and solid state disks (SSDs) use non-volatile memories as storage devices. Among non-volatile memories, flash memory electrically and collectively erases data in cells. For this reason, flash memories are widely used instead of hard disks. However, current flash memories have drawbacks.

SUMMARY

In accordance with one or more embodiments, a vertical non-volatile memory device includes a substrate including a cell region; a lower insulating layer on the substrate; a lower wiring pattern in the cell region having a predetermined pattern and connected to the substrate through the lower insulating layer; a plurality of vertical channel layers extending in a vertical direction relative to a top surface of the substrate in the cell region, spaced apart from one another in a horizontal direction relative to the top surface of the substrate, and electrically connected to the lower wiring pattern; and a plurality of gate electrodes stacked alternately with interlayer insulating layers in the cell region in the vertical direction along a side wall of a vertical channel layer and formed to extend in a first direction along the horizontal direction.

In accordance with one or more other embodiments, a vertical non-volatile memory device includes a substrate; a lower insulating layer on the substrate; a plurality of vertical channel layers on the lower insulating layer, extending in a vertical direction with respect to a top surface of the substrate, and spaced apart from one another in a horizontal direction with respect to the top surface of the substrate; a plurality of gate electrodes on the lower insulating layer, stacked alternately with interlayer insulating layers in the vertical direction along a side wall of the vertical channel layers, and extending in a first direction along the horizontal direction; a plurality of separation regions extending in the first direction and spaced apart in a second direction intersecting the first direction, the separation regions separating the gate electrodes from one another in the second direction; a lower wiring pattern including first wiring lines extending under the separation regions in the first direction and connected to the substrate through the lower insulating layer; and a horizontal channel layer on the lower wiring layer and the lower wiring pattern and electrically connecting the vertical channel layers to the lower wiring pattern.

In accordance with one or more other embodiments, a method for fabricating a vertical non-volatile memory device includes patterning a lower insulating layer on a substrate in a predetermined pattern to form a lower wiring trench exposing a top surface of the substrate; forming a first conductive layer covering a bottom surface and a side wall of the lower wiring trench, and forming a first sacrificial layer on the first conductive layer in the lower wiring trench; forming a second conductive layer on the lower insulating layer, the first conductive layer, and the first sacrificial layer; forming a mold insulating layer by alternatively stacking a first insulating layer and a second sacrificial layer on the second conductive layer, and forming a plurality of channel holes for exposing the second conductive layer by etching the mold insulating layer; etching and removing a portion of the second conductive layer exposed through each of the channel holes; forming a gate dielectric layer and a channel conductive layer in the channel hole and a part from which the second conductive layer have been removed; forming separation trenches formed to extend in a first direction and spaced apart from one another in a second direction intersecting the first direction by etching the mold insulating layer to expose the first conductive layer and the first sacrificial layer; etching and removing the first sacrificial layer exposed through a separation trench; etching and removing a part of the gate dielectric layer exposed by removing the first sacrificial layer; forming a replacement conductive layer covering an inner side of the separation trench and a top surface of the mold insulating layer and fill the part from which the first sacrificial layer has been removed; etching and removing the replacement conductive layer of the inner side of the separation trench to expose the second sacrificial layer at the side wall of the separation trench; and forming a gate electrode by replacing the second sacrificial layer with a metal.

In accordance with one or more other embodiments, a vertical non-volatile memory device includes a substrate; a plurality of vertical channels; a vertical stack of gate electrodes and insulating layers; a plurality of wiring patterns between the substrate and the vertical stack of gate electrodes and insulating layers, wherein the vertical channels are connected to the wiring patterns.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
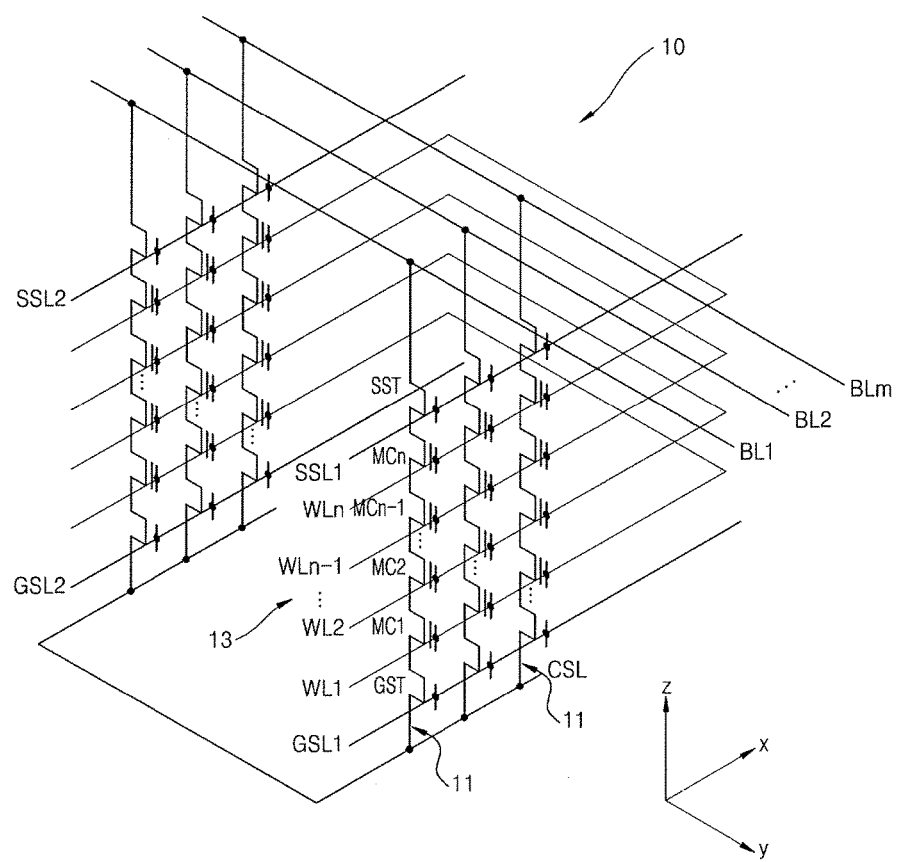
FIG. 1 illustrates an embodiment of a memory cell array.

FIG. 1 illustrates an embodiment of a memory cell array of a vertical non-volatile memory device, and particularly an equivalent circuit diagram of a vertical NAND (VNAND) flash memory device with a vertical channel structure.

Referring to FIG. 1, a memory cell array 10 of the vertical non-volatile memory device may include a plurality of memory cell strings 11. Each of the memory cell strings 11 may have a vertical structure extending in a vertical direction (z direction), which is vertical to a main surface of a substrate. A memory cell block 13 may include a plurality of the memory cell strings 11.

Each of the memory cell strings 11 may include a plurality of memory cells MC1, MC2, . . . , MCn−1, MCn, a string selection transistor SST, and a ground selection transistor GST. In each of the memory cell strings 11, the ground selection transistor GST, the memory cells MC1 to MCn, and the string selection transistor SST may be disposed in series in the vertical direction. The memory cells MC1, MC2, . . . , MCn−1, MCn store data. A plurality of word lines WL1, WL2, . . . , WLn−1, WLn may be in and control the memory cells MC1, MC2, . . . , MCn−1, MCn, respectively. The number of memory cells MC1, MC2, . . . , MCn−1, MCn may be selected appropriately according, for example, to the capacity of the semiconductor memory device.

A plurality of bit lines BL1, L2, . . . , BLm extending in a second direction (y direction) may be connected at one side of the memory cell strings 11 arranged in first to mth columns of the memory cell block 13, for example, to the drain of the string selection transistor SST. In addition, a common source line CSL may be connected at the other side of the memory cell strings 11, for example, to the source of the ground selection transistor GST.

A word line (e.g., WL1) extending in a first direction (x direction) may be commonly connected to gate electrodes of memory cells arranged in the same layer of the memory cell strings 11 (e.g., memory cells in the same layer as MC1). Data may be programmed into, read from, or erased from memory cells MC1, MC2, . . . , MCn−1, MCn by driving word lines WL1, WL, . . . , WLn−1, WLn.

The string selection transistors SST of each of the memory cell strings 11 may be arranged between a bit line (e.g., BL1) and the top memory cell MCn. In the memory cell block 13, each string selection transistor SST may control data transfer between a corresponding one of bit lines BL1, BL2, . . . , BLm and the plurality of memory cells MC1, MC2, . . . , MCn−1, MCn through a string selection line SSL connected to a gate electrode of the string selection transistor SST.

The ground selection transistor GST may be arranged between the bottom memory cell MC1 and the common source line CSL. In the memory cell array 10, the ground selection transistor GST may control data transfer between the common source line CSL and the memory cells MC1, MC2, . . . , MCn−1, MCn through a ground selection line GSL connected to a gate electrode of the ground selection transistor GST.

The vertical non-volatile memory device according to an embodiment may have a structure in which a vertical channel layer forming memory cells is electrically connected with a substrate through a lower wiring pattern on the substrate. Thus, according to an embodiment, a selective epitaxial growth process for connecting a vertical channel layer to a substrate and a process for etching a gate dielectric layer in a bottom surface of a channel hole, which are performed for existing VNANDs, may be omitted. As a result, the vertical non-volatile memory device according to an embodiment may be implemented as a vertical non-volatile memory device with low fabrication costs, realized by lowering a process difficulty level, high integration, and enhanced reliability based on the structure in which the vertical channel layer is electrically connected to the substrate through the lower wiring pattern.

Figure 2:
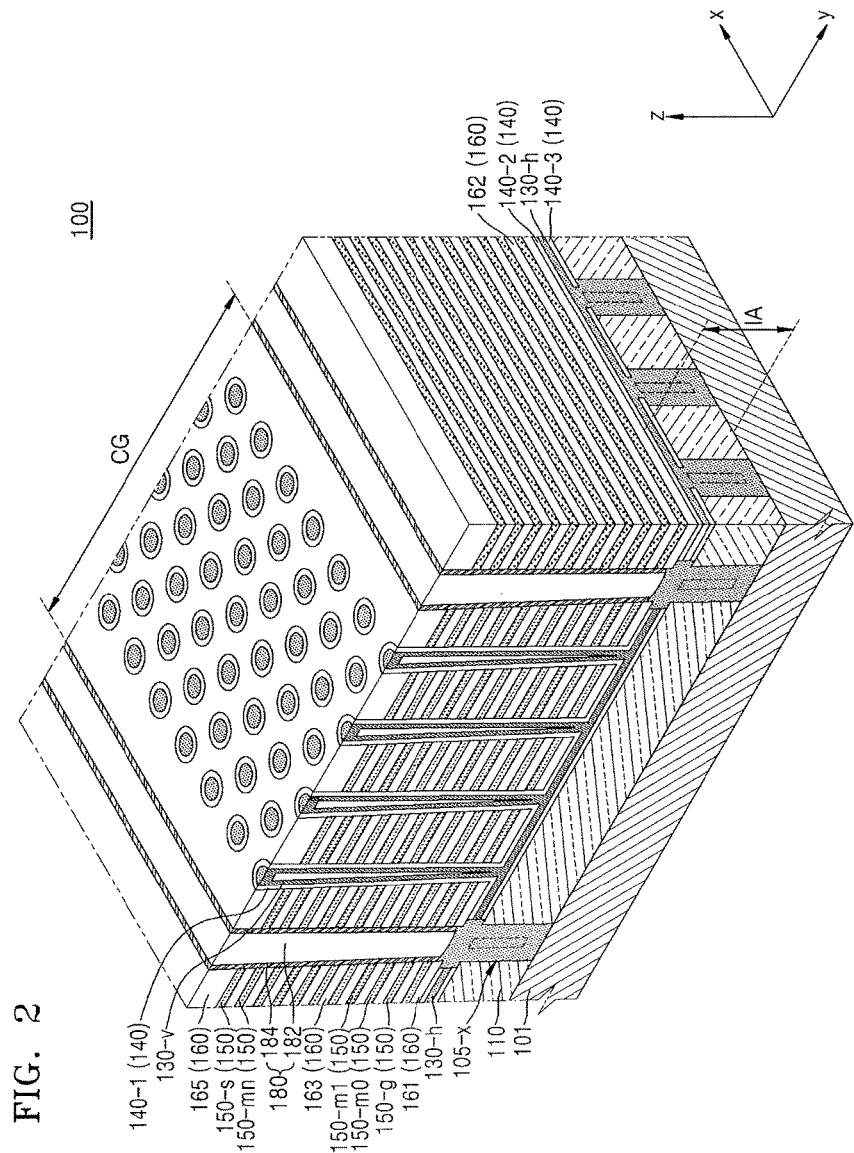
FIG. 2 illustrates an embodiment of a vertical non-volatile memory device.
Figure 3:
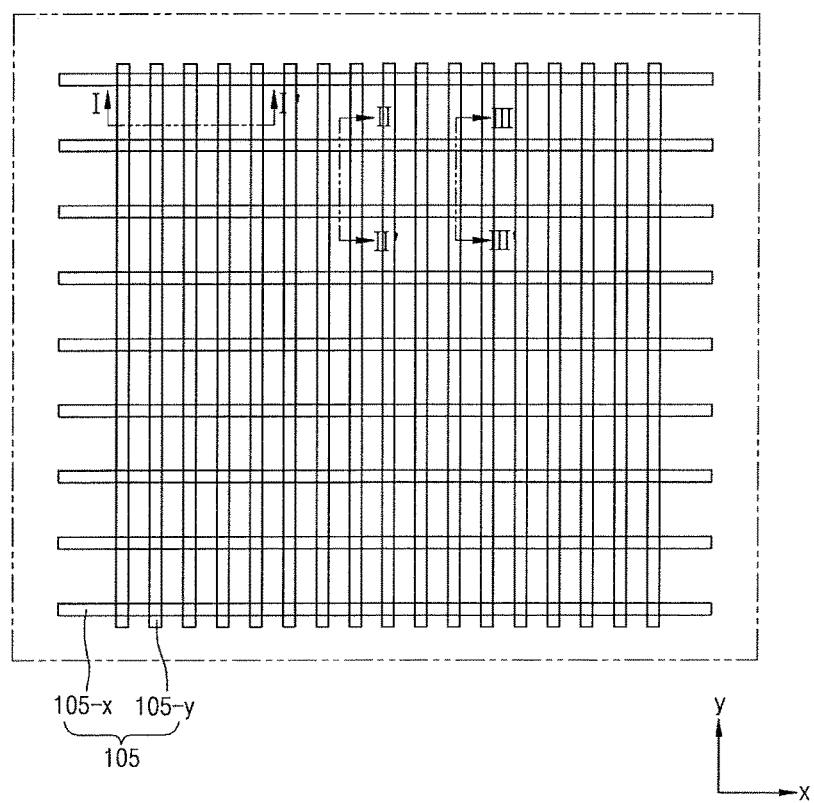
FIG. 3 illustrates a layout embodiment of a polysilicon wiring pattern.
Figure 4A:
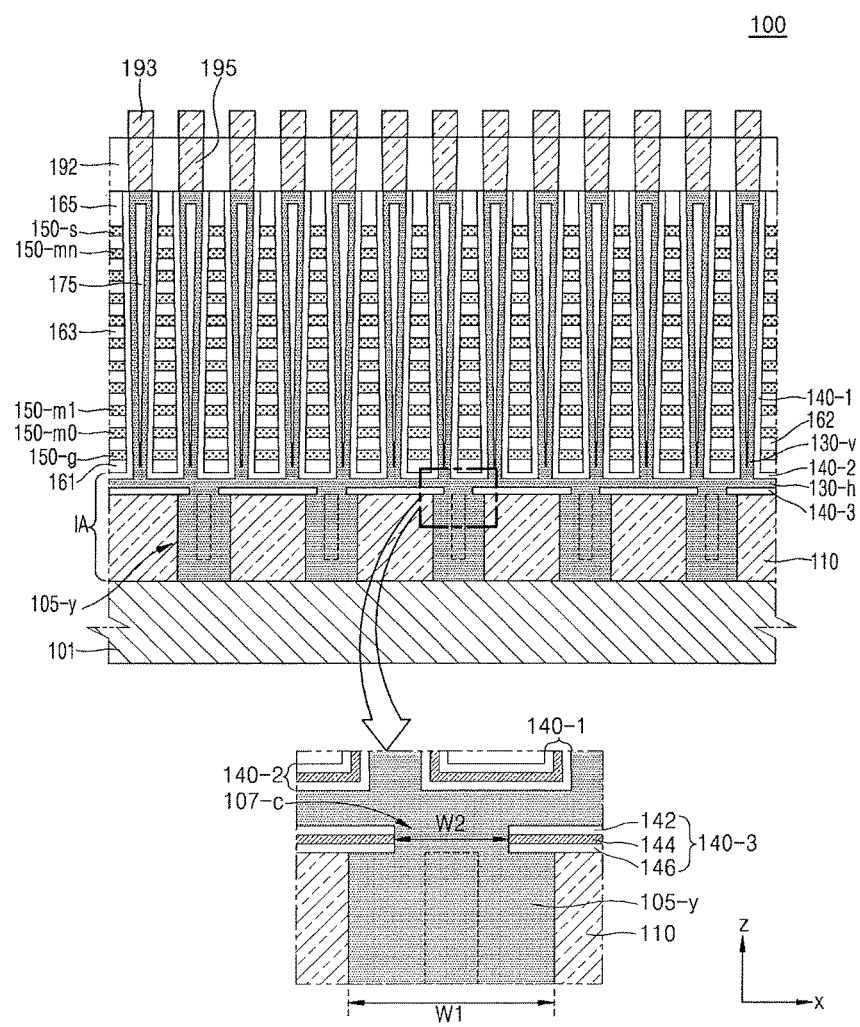
FIGS. 4A-4C illustrate view along section lines I-I', and in FIG. 3.
Figure 4B:
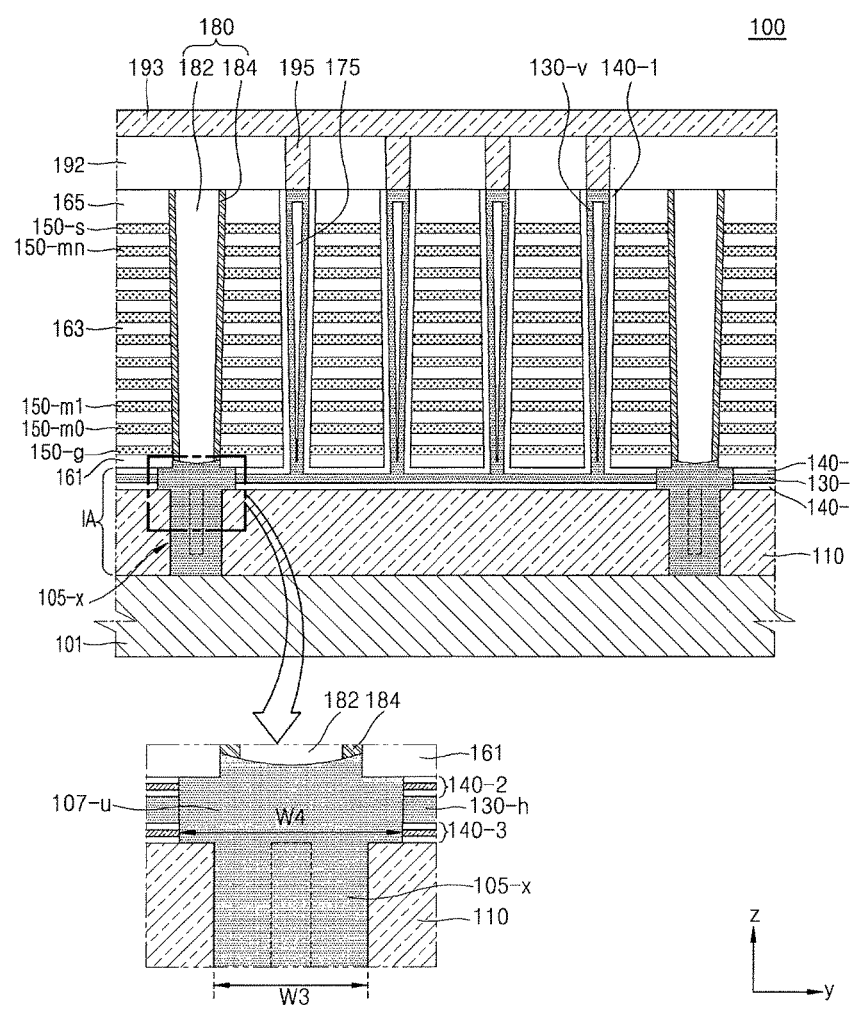
Figure 4C:
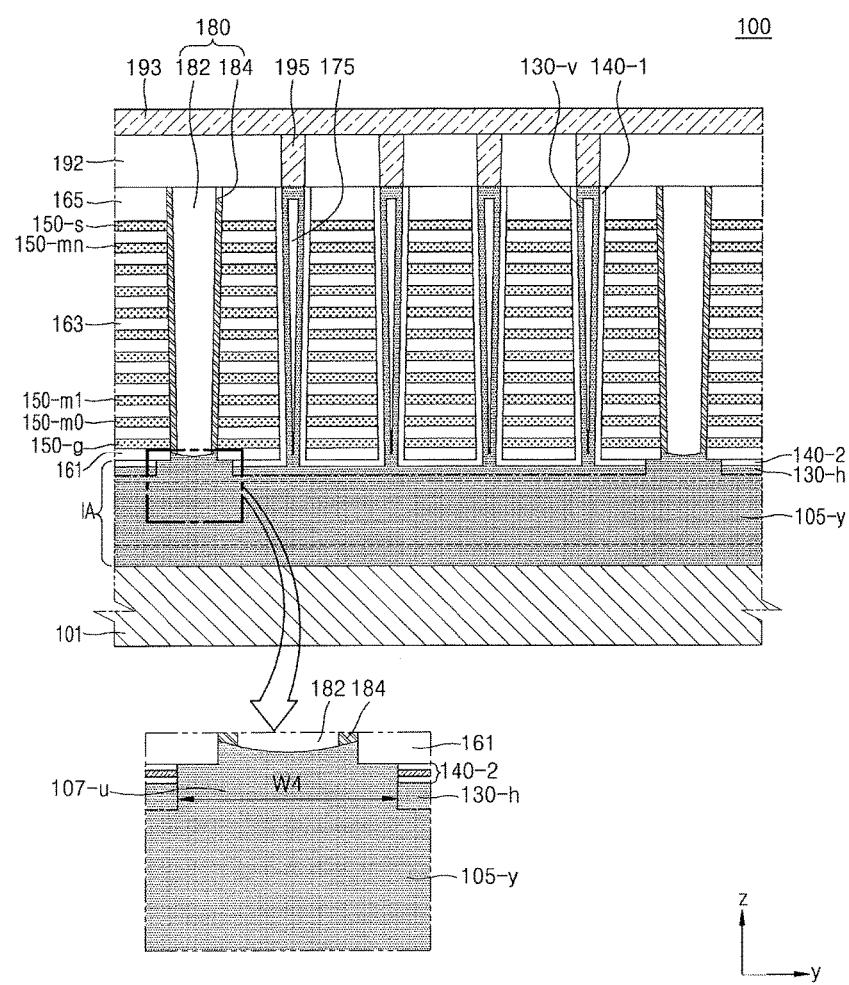

FIG. 2 illustrates an embodiment of a three-dimensional (3D) structure of a vertical non-volatile memory device. FIG. 3 illustrates a layout embodiment for a polysilicon wiring pattern for the vertical non-volatile memory device of FIG. 2. FIGS. 4A-4C illustrate cross-sectional views of the vertical non-volatile memory device in FIG. 2 taken along sections I-I', II-II', and III-III' of FIG. 3.

Referring to FIGS. 2-4C, a vertical non-volatile memory device 100 (a memory device) according to an embodiment includes a connection region IA and a cell string array group region CG, which are disposed on a substrate 101. The substrate 101 may have a main surface extending in the first direction (x direction) and the second direction (y direction). The substrate 101 may include a semiconductor material, for example, a Group IV semiconductor, a Group III-V semiconductor, or a Group II-VI semiconductor. The Group IV semiconductor may include, for example, silicon (Si), germanium (Ge), or silicon-germanium. The substrate 101 may be provided as a bulk wafer or an epitaxial layer. A cell region including a plurality of cell string array group regions CGs and a peripheral region outside the cell region may be on the substrate 101.

The connection region IA may be in the cell region on the substrate 101. For example, the connection region IA may be between the substrate 101 and the cell string array group region CG. The connection region IA may include a lower wiring pattern 105, a lower insulating layer 110, and a horizontal channel layer 130-h. The cell string array group region CG and thus the connection region IA may not be in the peripheral region.

Referring to FIG. 3, the lower wiring pattern 105 may be formed as a mesh pattern extending in the first direction (x direction) and the second direction (y direction). The lower wiring pattern 105 may be connected through an intersection or the horizontal channel layer 130-h. Accordingly, a part of the lower wiring pattern 105 may be electrically connected with another part. The lower wiring pattern 105 may be formed, for example, of polysilicon or another material.

The lower wiring pattern 105 may include first lower wiring patterns 105-x and second lower wiring patterns 105-y. The first lower wiring patterns 105-x extend in the first direction (x direction) and are spaced apart from one another in the second direction (y direction). The second lower wiring patterns 105-y extend in the second direction (y direction) and are spaced apart from one another in the first direction (x direction).

Referring to FIG. 4B or 4C, the first lower wiring patterns 105-x may be under a separation region 180 for separating gate electrodes 150. The gate electrodes 150 may include a gate electrode 150-g of the ground selection transistor GST (see FIG. 1), a dummy gate electrode 150-m0, gate electrodes 150-m1, ..., 150-mn of the memory cells MC1, MC2, ..., MCn−1, MCn (see FIG. 1), and a gate electrode 150-s of the string selection transistor SST (see FIG. 1). The separation region 180 may be formed in a word line cut WL Cut. The word line cut may denote a trench that extends in the first direction (x direction) in order to separate the gate electrodes 150.

A dashed rectangle at the center of the lower wiring pattern 105 of FIGS. 4A and 4B may denote part of the lower wiring pattern 105, which is formed by replacing a sacrificial layer (e.g., silicon nitride (SiN)) in an initial stage with polysilicon. Dashed lines in an upper portion and a lower portion of FIG. 4C may correspond to a lower part and an upper part of the dashed rectangle. A one-point chain line of FIG. 4C may denote a part in which the horizontal channel layer 130-h is in contact with the lower wiring pattern 105.

A contact layer 107-c or an upper wiring layer 107-u may be on the lower wiring pattern 105. The contact layer 107-c and the upper wiring layer 107-u may include polysilicon or another material.

Referring to an enlarged part of FIG. 4A, the contact layer 107-c may be on the second lower wiring patterns 105-y. The contact layer 107-c may electrically connect the second lower wiring patterns 105-y to the horizontal channel layer 130-h through a third gate dielectric layer 140-3. In the first direction (x direction), the second lower wiring patterns 105-y may have a first width W1 and the contact layer 107-c may have a second width W2. The second width W2 may be less than the first width W1. In one embodiment, the second width W2 may be similar to the first width W1.

Referring to an enlarged part of FIG. 4B, the upper wiring layer 107-u may be on the first lower wiring patterns 105-x. The upper wiring layer 107-u may connect the first lower wiring patterns 105-x to a metal layer 182 of the separation region 180. The horizontal channel layer 130-h, a second gate dielectric layer 140-2, and the third gate dielectric layer 140-3 may be in contact with different sides of the upper wiring layer 107-u.

In the second direction (y direction), the first lower wiring patterns 105-x may have a third width W3 and the upper wiring layer 107-u may have a fourth width W4. The fourth width W4 may be greater than the third width W3. In one embodiment, the fourth width W4 may be similar to the third width W3. The third width W3 of the first lower wiring patterns 105-x may be substantially the same as or different from the first width W1 of the second lower wiring patterns 105-y.

The upper wiring layer 107-u may contain carbon (C). In addition, the upper wiring layer 107-u may include an n-type ion, e.g., s phosphorus, arsenic, or antimony. Because upper wiring layer 107-u contains carbon, etching may be suppressed in a wet etching process for polysilicon. Accordingly, the fourth width W4 of the upper wiring layer 107-u may vary depending on a carbon-doped area. Because the upper wiring layer 107-u includes an n-type ion, the upper wiring layer 107-u may be used as an electron transfer passage to shorten an electric current path.

Referring to FIG. 4C, the lower wiring pattern 105 may include the first lower wiring patterns 105-x and the second lower wiring patterns 105-y. For example, a lower part of the separation region 180 may correspond to the first lower wiring patterns 105-x. The remaining part may correspond to the second lower wiring patterns 105-y. Accordingly, in FIG. 4C, the upper wiring layer 107-u is under the separation region 180. An upper portion (between a one-point chain line and a dashed line) of the second lower wiring patterns 105-y adjacent to the horizontal channel layer 130-h corresponds to the contact layer 107-c.

The lower insulating layer 110 may be in the lower wiring pattern 105. The lower insulating layer 110 may be formed as an insulating layer, for example, of an oxide or nitride. For example, in the memory device 100 according to an embodiment, the lower insulating layer 110 may include silicon oxide ($SiO_2$), silicon nitride, or another material.

The horizontal channel layer 130-h may be in the cell region over the lower insulating layer 110 and the lower wiring pattern 105. For example, the horizontal channel layer 130-h may have a structure such as a flat plate parallel to the main surface of the substrate 101. The horizontal channel layer 130-h may be formed, for example, of polysilicon or another material.

The horizontal channel layer 130-h may be separated by the upper wiring layer 107-u. In one embodiment, when the horizontal channel layer 130-h and the upper wiring layer 107-u are formed of polysilicon, the separation may not be distinct. In addition, because the horizontal channel layer 130-h and the upper wiring layer 107-u are formed as conductive layers, the separation may not have a great significance in terms of electrical properties.

Structurally, the horizontal channel layer 130-h may extend in a horizontal direction at the bottom of a vertical channel layer 130-v. Accordingly, the vertical channel layer 130-v may have a structure connected to the horizontal channel layer 130-h. The gate dielectric layers 140-2 and 140-3 may be on a top surface and a bottom surface of the horizontal channel layer 130-h. For example, the second gate dielectric layer 140-2 may be between the horizontal channel layer 130-h and a bottom interlayer insulating layer 161. The third gate dielectric layer 140-3 may be between the horizontal channel layer 130-h and the lower insulating layer 110. As described above, the contact layer 107 has a structure that passes through the third gate dielectric layer 140-3 and may be disposed on the second lower wiring patterns 105-y. The horizontal channel layer 130-h may be electrically connected to the second lower wiring patterns 105-y through the contact layer 107-c. In addition, the horizontal channel layer 130-h may be electrically connected to the first lower wiring pattern 105-x through the upper wiring layer 107-u.

The gate dielectric layer 140 may include a first gate dielectric layer 140-1 along a side wall of the vertical channel layer 130-v, the second gate dielectric layer 140-2 over the horizontal channel layer 130-h, and the third gate dielectric layer 140-3 under the horizontal channel layer 130-h. As shown in the enlarged parts of FIGS. 4A to 4C, each of the first gate dielectric layer 140-1, the second gate dielectric layer 140-2, and the third gate dielectric layer 140-3 may include a stacked structure of a tunnelling insulating film 142, a charge storage film 144, and a blocking insulating film 146. The tunnelling insulating film 142 may tunnel electric charges into the charge storage film 144 in Fowler-Nordheim (FN) regime. The tunnelling insulating film 142 may include, for example, silicon oxide. The charge storage film 144 may include a charge trap layer. The charge storage film 144 may include a quantum dot or a nanocrystal. The quantum dot or nanocrystal may include fine particles of an electric conductor, for example, a metal or semiconductor. The blocking insulating film 146 may include a high dielectric (high-k) constant material. The high dielectric constant material may denote a dielectric material with a dielectric constant higher than that of a silicon oxide film.

The gate dielectric layer 140 may be referred to as an oxide-nitride-oxide (ONO) film based on properties of the layers. In addition, the gate dielectric layer 140 may be referred to as an oxide-nitride-alumina (ONA) film or an oxide-nitride-oxide-alumina (ONOA) film based on properties of the layers. The third gate dielectric layer 140-3 has substantially the same layered structure as the first gate dielectric layer 140-1 and the second gate dielectric layer 140-2 and does not function as a gate dielectric layer.

A plurality of cell string array group regions CGs may be in the cell region of the substrate 101. The cell string array group regions CGs may be on the connection region IA and separated from each other by the separation region 180 in the second direction (y direction). The memory cell strings 11 (e.g., see FIG. 1) may be in each of the cell string array group regions CGs. Each of the memory cell strings may include the ground selection transistor GST (see FIG. 1), memory cells MC1, MC2, . . . , MCn−1, MCn (e.g., see FIG. 1), and the string selection transistor SST (e.g., see FIG. 1), which are disposed according to the side wall of the vertical channel layer 130-$v$. In some cases, two ground selection transistors and two string selection transistors may be provided.

The vertical channel layer 130-$v$ may have a structure that extends in the connection region IA in the third direction (z direction). Referring to FIG. 2, the vertical channel layer 130-$v$ may be spaced apart from another vertical channel layer in the first direction (x direction) and the second direction (y direction). In addition, a vertical channel layer 130-$v$ belonging to any one line in the first direction (x direction) and the second direction (y direction) may be disposed alternately with a vertical channel layer 130-$v$ of an adjacent line.

In the memory device 100 according to an embodiment, four vertical channel layers 130-$v$ are in the second direction (y direction). In another embodiment, the vertical channel layers 130-$v$ may have another arrangement structure. For example, three or less vertical channel layers 130-$v$ or five or more vertical channel layers 130-$v$ may be arranged in the second direction (y direction). The vertical channel layer 130-$v$ may have, for example, a cylindrical shape. In one embodiment, the vertical channel layer 130-$v$ may have a pillar shape, e.g., a cylindrical pillar or a square pillar shape. In one embodiment, the vertical channel layer 130-$v$ or may be formed only at respective side surfaces and the bottom surface of the square pillar. As shown, the vertical channel layer 130-$v$ may have a structure with a width that progressively narrows downward, e.g., a tapered width. However, horizontal sections of an upper portion and a lower portion of the vertical channel layer 130-$v$ may have substantially the same area by precisely controlling an etching process.

Since the vertical channel layer 130-$v$ is in contact with the horizontal channel layer 130-$h$ at the bottom and the horizontal channel layer 130-$h$ is in contact with the substrate 101 through the lower wiring pattern 105, the vertical channel layer 130-$v$ may be electrically connected to the substrate 101. The vertical channel layer 130-$v$ may include a semiconductor material, e.g., polysilicon or single-crystal silicon. The semiconductor material may be doped with p-type or n-type impurity ions. A buried insulating layer 175 (e.g., with a cylindrical pillar structure) may be formed inside the vertical channel layer 130-$v$. In one embodiment, the buried insulating layer 175 may be omitted when the vertical channel layer 130-$v$ has, for example, a pillar structure.

Bit lines 193 (e.g., BL1, BL2, . . . , BLm of FIG. 1) may be connected to drains of the string selection transistors SSTs (e.g., see FIG. 1). For example, the bit lines 193 may be formed as lines that extend in the second direction (y direction) and are spaced apart from one another in the first direction (x direction). The bit lines 193 may be electrically connected to the string selection transistors SSTs (e.g., see FIG. 1) through a contact plug 195 formed on the vertical channel layer 130-$v$. The ground selection transistors GSTs (FIG. 1) may be electrically connected to impurity regions adjacent to the ground selection transistors GSTs.

The impurity regions may be formed by doping the first lower wiring patterns 105-$x$ and the upper wiring layer 107-$u$ with impurity ions. Thus, the impurity regions may extend adjacent to the substrate 101 in the first direction (x direction) and also may be spaced apart from one another in the second direction (y direction). The impurity region may correspond to a common source region. Each of the impurity regions may include a high-doped impurity region for ohmic-contact with the metal layer 182 of the separation region 180.

The metal layer 182 of the separation region 180 may be on the impurity regions, for example, the upper wiring layer 107-$u$. The metal layer 182 may correspond to a common source line. A metal silicide (e.g., cobalt silicide ($CoSi_x$)) may be at the bottom of the metal layer 182. The metal layer 182 may be formed of, for example, W, Al, or Cu. The metal layer 182 may have a structure in which a barrier metal layer such as Ti/TiN and a wiring metal layer such as tungsten are stacked.

The separation region 180 may be between neighboring memory cell strings that use different gate electrodes 150. For example, the separation region 180 may extend in the first direction (x direction), may be spaced apart in the second direction (y direction), and may separate the gate electrodes 150 from each other in the second direction (y direction). The separation region 180 may include the metal layer 182 and an insulating spacer 184.

In the memory device 100 according to an embodiment, the metal layer 182 and the insulating spacer 184 may have a structure that extends higher than gate electrodes 150-$s$ of the string selection transistors SSTs (e.g., see FIG. 1). The separation region 180 may have a different structure in another embodiment. For example, the metal layer 182 may be adjacent to the impurity region and have a small thickness so that the metal layer 182 does not exceed the bottom interlayer insulating layer 161. The separation region 180 may be formed in a structure in which a buried insulating layer is disposed thereon. For such a structure, the insulating spacer may be omitted. In addition, the insulating spacer 184 may be formed only to a side wall of the gate electrode 150-$g$ of the ground selection transistor GST (e.g., see FIG. 1). The metal layer 182 may have a predetermined thickness in the insulating spacer 184. The separation region 180 may also be formed in a structure in which the buried insulating layer is disposed thereon.

The gate electrodes 150 may be stacked alternately with interlayer insulating layers 160 in the third direction (z direction) from the connection region IA along the side surface of the vertical channel layer 130-$v$. The gate electrode 150 may include the gate electrodes 150-$g$ of the ground selection transistor GST (e.g., see FIG. 1), the gate electrodes 150-$m1$, . . . , 150-$mn$ of the memory cells MC1, MC2, MCn−1, MCn (e.g., see FIG. 1), and the gate electrode 150-$s$ of the string selection transistor SST (see FIG. 1), and the dummy gate electrode 150-$m0$. The gate electrode 150 may be connected in common to the memory cell strings. The gate electrode 150-$s$ of the string selection transistor SST (e.g., see FIG. 1) may be connected to the string selection line SSL (e.g., see FIG. 1). The gate electrodes 150-$m1$, . . . , 150-$mn$ of the memory cells MC1, MC2, MCn−1, MCn (e.g., see FIG. 1) may be connected to the word lines WL1, WL2, WLn−1, WLn (e.g., see FIG. 1). The gate electrode 150-$g$ of the ground selection transistor GST (e.g., see FIG. 1) may be connected to the ground selection line GSL (e.g., see FIG. 1). The gate electrode 150 may be formed of a metal, for example, tungsten (W). In addition, the gate electrode 150 may include a diffusion barrier made, for example, of tungsten nitride (WN), tantalum nitride (TaN), or titanium nitride (TiN).

The gate electrode 150-$m0$ above the gate electrode 150-$g$ of the ground selection transistor GST (see FIG. 1) may be a dummy gate electrode and may not constitute a memory cell. In the existing VNAND structure, an interlayer insulating layer 162 between the gate electrode 150-$g$ and the dummy gate electrode 150-$m0$ may be thicker than an interlayer insulating layer between the gate electrodes 150-$m1$, . . . , 150-$mn$ of the memory cells. However, in the memory device 100 according to an embodiment, the interlayer insulating layer 162 may have substantially the same thickness as an interlayer insulating layer 163 for the memory cells. The interlayer insulating layer 162 may be formed to a different thickness.

Interlayer insulating layers 160 may be between the gate electrodes 150. Like the gate electrodes 150, the interlayer insulating layers 160 may be spaced apart from one another in the third direction (z direction) and may extend in the first direction (x direction). At least one side of the interlayer insulating layers 160 may be in contact with the first gate dielectric layer 140-1. The interlayer insulating layers 160 may be formed, for example, of silicon oxide or silicon nitride.

Referring again to FIG. 2, one string selection transistor SST (e.g., see FIG. 1) and one ground selection transistor GST (see FIG. 1) are arranged. In one embodiment, two string selection transistors SSTs (e.g., see FIG. 1) and two ground selection transistors GSTs (e.g., see FIG. 1) may be formed. In addition, the string selection transistor SST (e.g., see FIG. 1) and the ground selection transistor GST (e.g., see FIG. 1) may have different structures from the memory cells MC1, MC2, MCn−1, MCn (e.g., see FIG. 1).

The memory device 100 according to an embodiment may have a structure in which the lower wiring pattern 105 of polysilicon is formed on the substrate 101 and the vertical channel layer 130-$v$ is electrically connected to the substrate 101 through the lower wiring pattern 105. Thus, the memory device 100 according to an embodiment may lower a process difficulty level and also may increase integration and enhance reliability, because an SEG process and a channel hole bottom etching process, which are essential to presently existing VNAND, may be omitted. For example, for the SEG process, it may be difficult to adjust the height, and it may also be difficult to etch the gate dielectric layer of the bottom surface because the area of the bottom surface decreases as the height of the channel hole increases. Accordingly, existing VNAND structures may have a limitation in increasing the degree of integration and may also have a reliability issue due to high difficulty levels of the SEG process and the bottom surface etching process. However, the memory device 100 according to an embodiment may solve problems of the existing VNAND because the vertical channel layer 130-$v$ and the substrate 101 are connected through the lower wiring pattern 105.

In the memory device 100 according to an embodiment, an erase operation may be performed using the second lower wiring pattern 105-$y$ for connecting the vertical channel layer 103-$v$ and the substrate 101. In addition, programming and reading may be performed using the horizontal channel layer 130-$h$ for connecting the metal layer 182 of the separation region 180, that is, the common source line and the vertical channel layer 103-$v$.

Figure 5A:
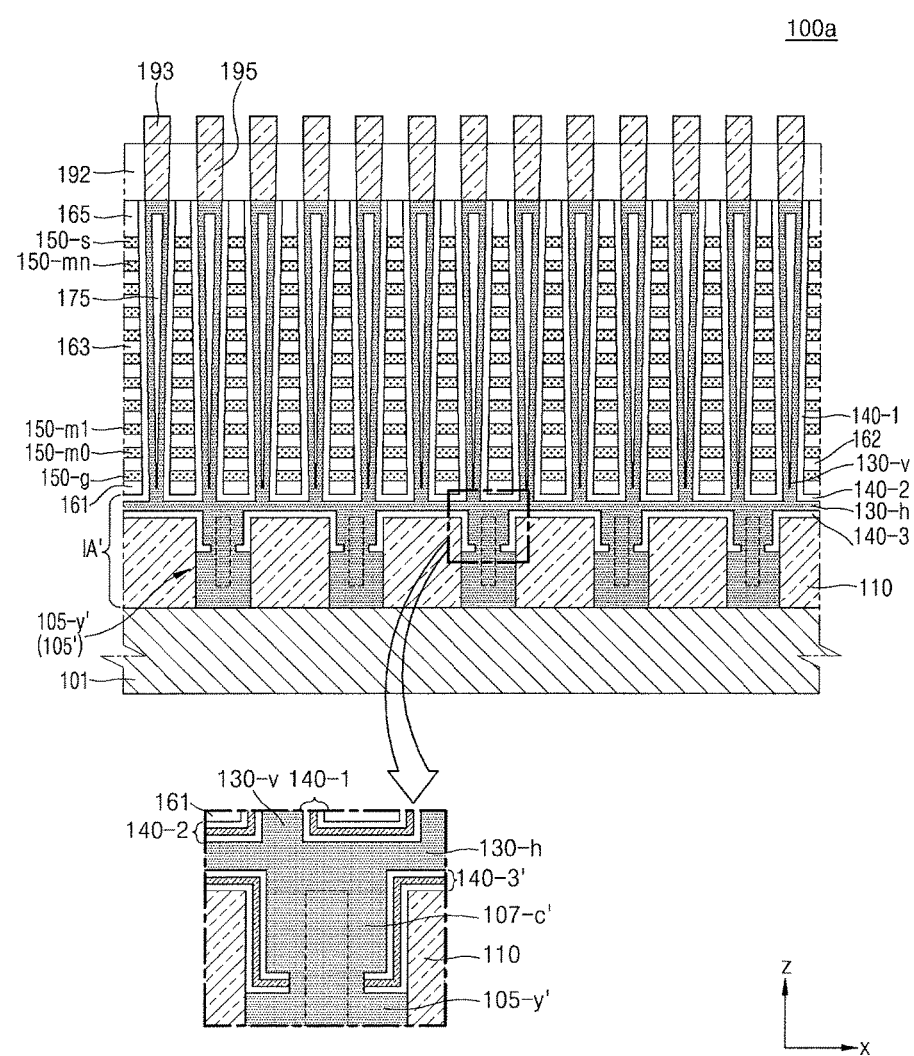
FIGS. 5A-5C illustrate other sectional embodiments of a vertical non-volatile memory device.
Figure 5B:
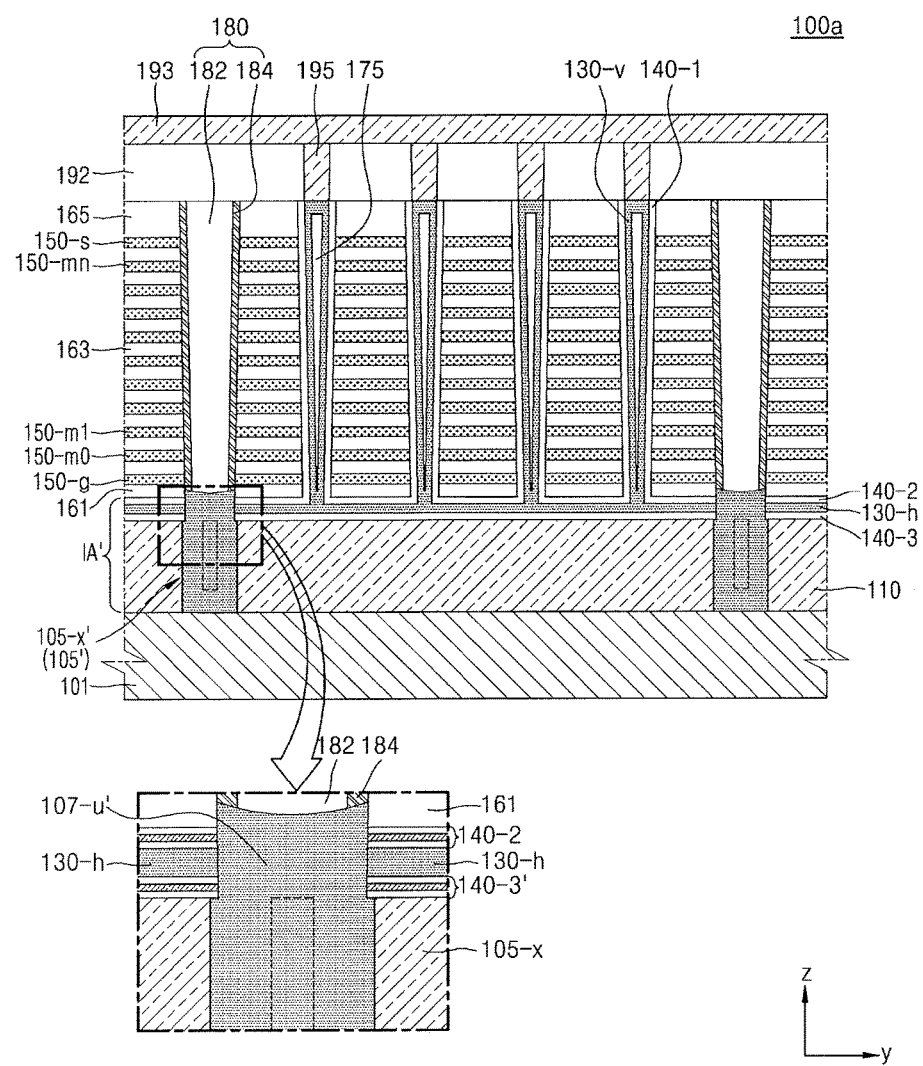
Figure 5C:
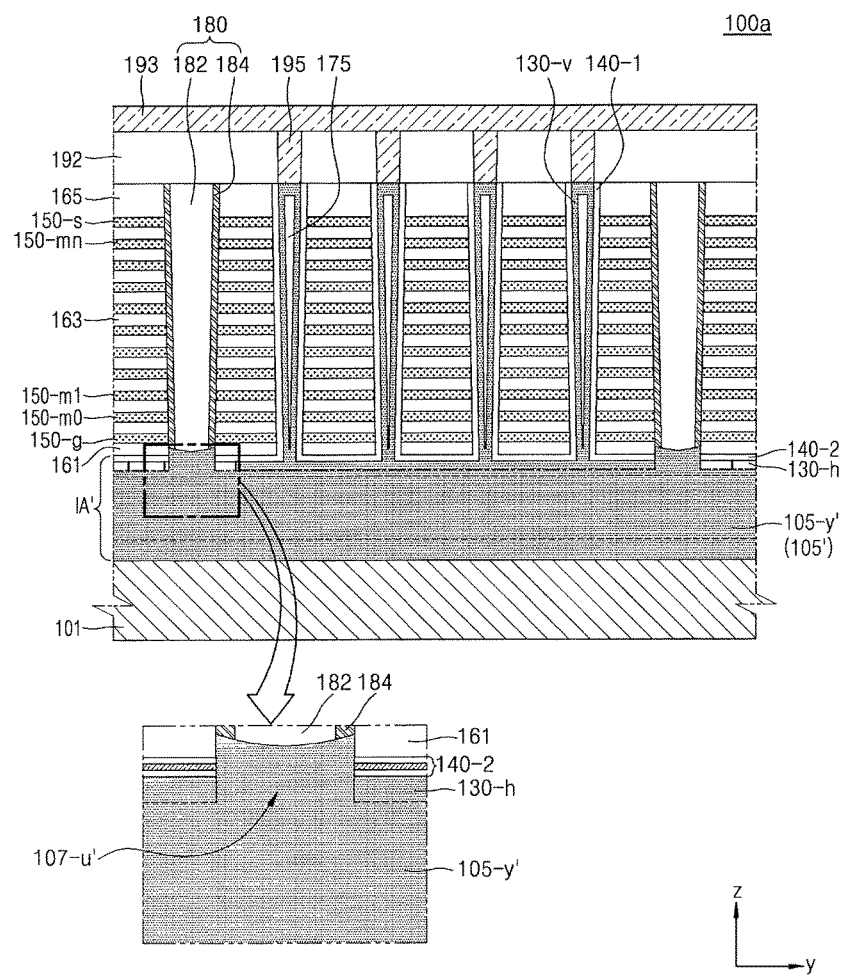

FIGS. 5A-5C are cross-sectional views, corresponding to FIGS. 4A-4C, of the vertical non-volatile memory device according to an embodiment. Referring to FIGS. 5A-5C, a memory device 100$a$ according to an embodiment may be different from the memory device 100 of FIG. 2 with respect to a structure of the connection region IA', in particular, the lower wiring pattern 105'. As shown in FIG. 5A, in the memory device 100$a$ according to an embodiment, the top of the second lower wiring pattern 105-$y$' may become lower than the top of the lower insulating layer 110. Thus, the thickness of the contact layer 107-$c$' may increase. The contact layer 107-$c$' may have a width that progressively decreases in the first direction (x direction) so that a lower portion is narrower than an upper portion. The lower portion of the contact layer 107-$c$' is connected to the second lower wiring pattern 105-$y$' through a portion of the third gate dielectric layer 140-3'. The upper portion of the contact layer 107-$c$' may be connected to the horizontal channel layer 130-$h$.

The third gate dielectric layer 140-3' may have a structure that extends vertically downward along respective sides of the contact layer 107-$c$' and then extends horizontally at the top of the lower wiring pattern 105-$y$'.

Referring to FIG. 5B, the first lower wiring pattern 105-$x$ does not change greatly and the structure of the upper wiring layer 107-$u$' varies slightly. For example, in the second direction (y direction), the upper wiring layer 107-$u$' may have a width less than the first lower wiring pattern 105-$x$. The upper wiring layer 107-$u$' may also connect the first lower wiring pattern 105-$x$ to the metal layer of the separation region 180. The horizontal channel layer 130-$h$, the second gate dielectric layer 140-2, and the third gate dielectric layer 140-3' may be in contact with different sides of the upper wiring layer 107-$u$'.

The structure of the memory device 100$a$ according to an embodiment may result from a fact that a conductive layer forming the lower wiring pattern 105 and the upper wiring layer 107-$u$' during the fabrication process is not doped with carbon.

Figure 6:
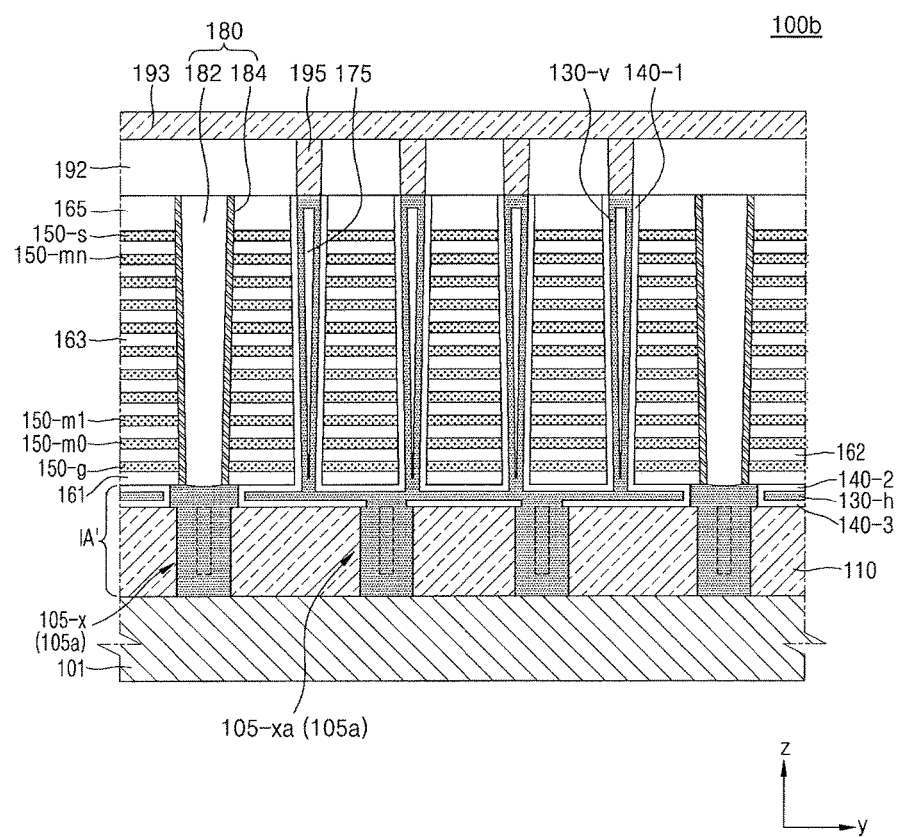
FIG. 6 illustrates a cross-sectional embodiment corresponding to FIG. 4B.

FIG. 6 is a cross-sectional view, corresponding to FIG. 4B, of the vertical non-volatile memory device 100$b$ according to an embodiment. Referring to FIG. 6, the memory device 100$b$ may be different from the memory device 100 in FIG. 2 with respect to a structure of the lower wiring pattern 105$a$. For example, in the memory device 100$b$ according to an embodiment, the lower wiring pattern 105$a$ may further include at least one or more third lower wiring patterns 105-$xa$ between the first lower wiring patterns 105-$x$.

Like the first lower wiring patterns 105-$x$, the third lower wiring patterns 105-$xa$ may extend in the first direction (x direction) and be spaced apart from one another in the second direction (y direction). In addition, like the second lower wiring patterns 105-$y$ (e.g., see FIG. 4A), the third lower wiring patterns 105-$xa$ may have the contact layer 107-$c$ on the top thereof. The contact layer 107-$c$ may connect the third lower wiring patterns 105-$xa$ to the horizontal channel layer 130-$h$ through the third gate dielectric layer 140-3.

In addition, the horizontal channel layer 130-*h*, the second lower wiring pattern 105-*y*, etc. may have substantially the same structures as those of the memory device 100 in FIG. 2.

Since the third lower wiring pattern 105-*xa* is additionally formed in the memory device 100*b*, the number of connection parts between the vertical channel layer 130-*v* and the substrate 101 may increase. In addition, the memory device 100*b* may contribute to enhancement of reliability of the memory device by more easily removing the sacrificial layer and the gate dielectric layer through the third lower wiring patterns 105-*xa* during the fabrication process.

Figure 7A:
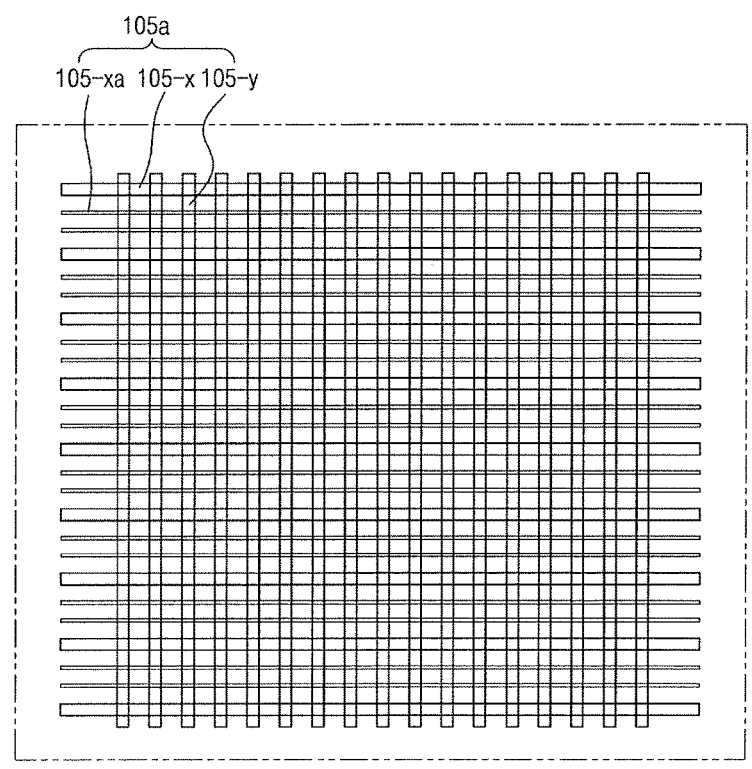
FIGS. 7A-7B illustrate layout embodiments for a polysilicon wiring pattern of FIG. 6.
Figure 7B:
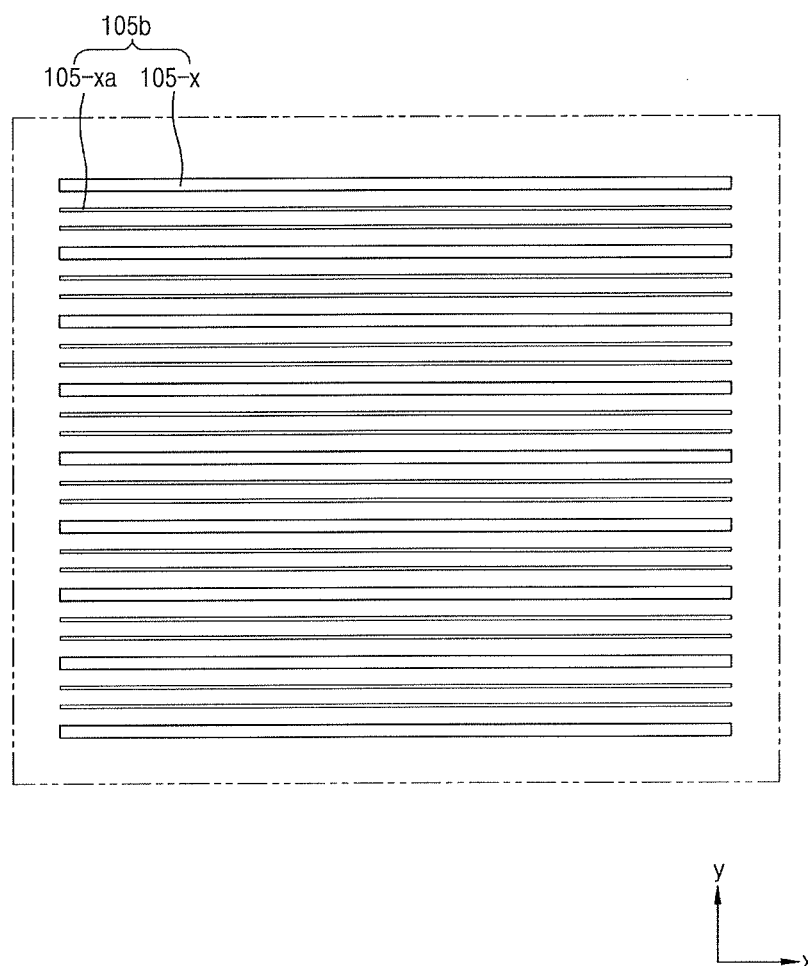

FIGS. 7A-7B illustrate layout embodiments for a polysilicon wiring pattern for the vertical non-volatile memory device in FIG. 6. Referring to FIG. 7A, a lower wiring pattern 105*a* may include first lower wiring patterns 105-*x*, second lowering wiring patterns 105-*y*, and third lower wiring patterns 105-*xa*. The first lower wiring patterns 105-*x* and the third lower wiring patterns 105-*xa* may extend in the first direction (x direction) and be spaced apart from one another in the second direction (y direction). The second lower wiring patterns 105-*y* may extend in the second direction (y direction) and be spaced apart from one another in the first direction (x direction). The first lower wiring pattern 105-*x* and the third lower wiring pattern 105-*xa* may be connected with the second lower wiring pattern 105-*y* at a cross point. Accordingly, the first lower wiring pattern 105-*x*, the second lower wiring pattern 105-*y*, and the third lower wiring pattern 105-*xa* may be electrically connected to each other. In addition, all of the lower wiring patterns may be connected to a horizontal channel layer 130-*h* disposed thereon, and thus may be electrically connected through the horizontal channel layer 130-*h*.

Referring to FIG. 7A, the third lower wiring pattern 105-*xa* is shown to be thin. This is intended to distinguish the third lower wiring pattern 105-*xa* from the first lower wiring pattern 105-*x*. In one embodiment, the first lower wiring pattern 105-*x* may have substantially the same width in the second direction (y direction) as the third lower wiring pattern 105-*xa*.

Referring to FIG. 7B, a lower wiring pattern 105*b* may include only the first lower wiring pattern 105-*x* and the third lower wiring pattern 105-*xa*, but not the second lower wiring pattern. When the lower wiring pattern 105*b* has the above structure, a trench that extends in the second direction (y direction) may be formed in a third lower wiring pattern 105-*xa* in an expansion region outside a cell region. A process for removing a sacrificial layer and a gate dielectric layer and a process for replacing with polysilicon may be performed through the trench in the third lower wiring pattern 105-*xa*. In addition, in order to easily perform the processes, several second lower wiring patterns 105-*y* may be formed in the cell region in the first direction (x direction) at wide intervals.

Referring to FIGS. 3, 7A, and 7B, the structure of the lower wiring patterns 105, 105*a*, and 105*b* is illustrated as a mesh or a line. In one embodiment, the structure of the lower wiring patterns may have a different structure. For example, the lower wiring patterns of the memory device may have a structure that allows for easy removal of the sacrificial layer and the gate dielectric layer, and allows for replacement with polysilicon and of connecting vertical channel layer 130-*v* to the substrate.

FIGS. 8A-20C are cross-sectional views of various stages of an embodiment of a method for fabricating the vertical non-volatile memory device in FIG. 2. Except for FIG. 12C, cross-sectional views marked with "A," such as FIG. 8A and FIG. 9A, correspond to the cross-sectional view of FIG. 4A, cross-sectional views marked with "B," such as FIG. 8B and FIG. 9B, correspond to the cross-sectional view of FIG. 4B, and cross-sectional views marked with "C," such as FIG. 16C and FIG. 17C, correspond to the cross-sectional view of FIG. 4C. When a cross section view marked with "C" is not shown, the cross-sectional view marked with "C" may be the same as a cross-sectional view marked with "B."

Figure 8A:
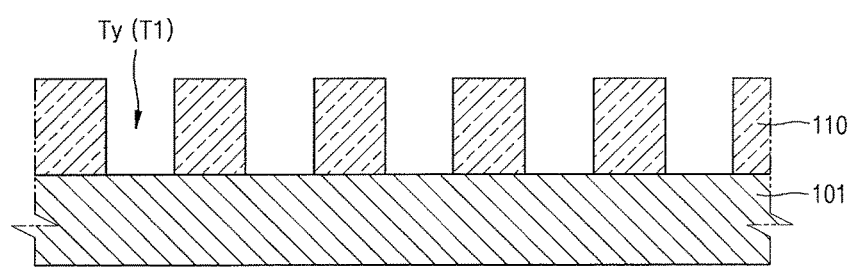
FIGS. 8A-20C illustrate various stages of an embodiment of a method for fabricating the vertical non-volatile memory device in FIG. 2.
Figure 8B:
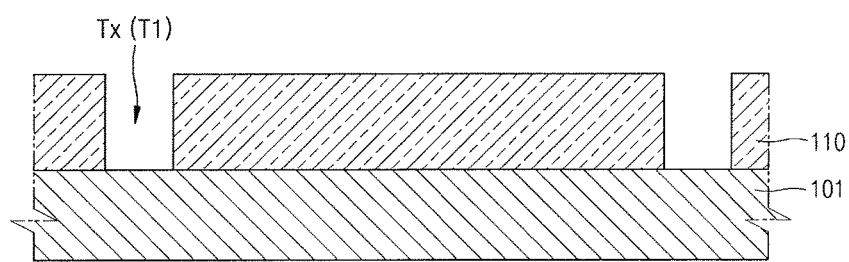

Referring to FIGS. 8A and 8B, a lower insulating layer 110 is formed on a substrate 101. The lower insulating layer 110 may be formed, for example, of an oxide or nitride. The lower insulating layer 110 may be formed of silicon oxide or another material.

After the lower insulating layer 110 is formed, lower wiring trenches T1 are formed. The shape of the lower wiring trenches T1 may vary depending, for example, on the form of the lower wiring pattern intended to be implemented. For example, the lower wiring trench may be formed as a mesh by including x-direction trenches Tx that extend in the first direction (x direction) and are spaced apart from one another in the second direction (y direction) and y-direction trenches Ty that extend in the second direction (y direction) and are spaced apart from one another.

A y-direction trench Ty may correspond to a second lower wiring pattern 105-*y* (e.g., see FIG. 4A) and may serve as a passage that connects the substrate 101 to the horizontal channel layer 130-*h*. The y-direction trench Ty may not be formed in an expansion region outside the cell region. An x-direction trench Tx may correspond to a first lower wiring pattern 105-*x* (e.g., see FIG. 4B), may separate a word line cut and the lower insulating layer 110, and may serve as a passage for a process of removing the sacrificial layer and gate dielectric layer that are to be replaced with polysilicon.

Figure 9A:
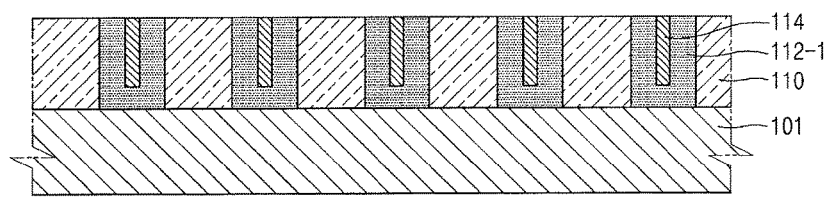
Figure 9B:
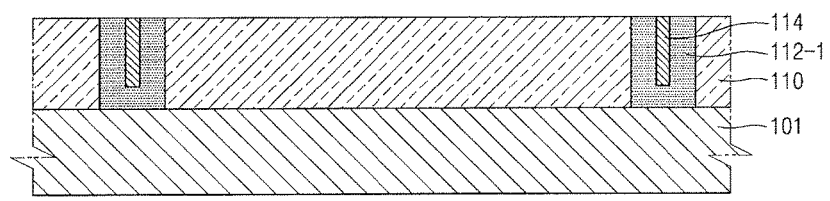

Referring to FIGS. 9A and 9B, a conductive layer and a sacrificial layer are sequentially formed on the substrate 101 and the lower insulating layer 110 in order to completely fill the lower wiring trench T1. The conductive layer may be formed, for example, of polysilicon. The sacrificial layer may be formed, for example, of silicon nitride. The materials of the conductive layer and the sacrificial layer may be different in another embodiment. For example, the sacrificial layer may also be formed of silicon oxide. However, in one embodiment, the sacrificial layer may be formed of substantially the same material as a sacrificial layer forming a mold insulating layer.

After the conductive layer and the sacrificial layer are formed, a planarization process exposes the top of the lower insulating layer 110. The planarization process may include, for example, a chemical mechanical polishing (CMP) process. Through the planarization process, a first conductive layer 112-1 and a first sacrificial layer 114 may be formed in the lower wiring trench. The first conductive layer 112-1 may, for example, serve to protect the lower insulating layer 110 in a wet-etching process for a gate dielectric layer. The first sacrificial layer 114 may be removed, for example, through a pull-back (P/B) process after the word line cut process. The removed part may be used as a passage for performing wet-etching of the gate dielectric layer and a passage for a replacement process with polysilicon.

Figure 10A:
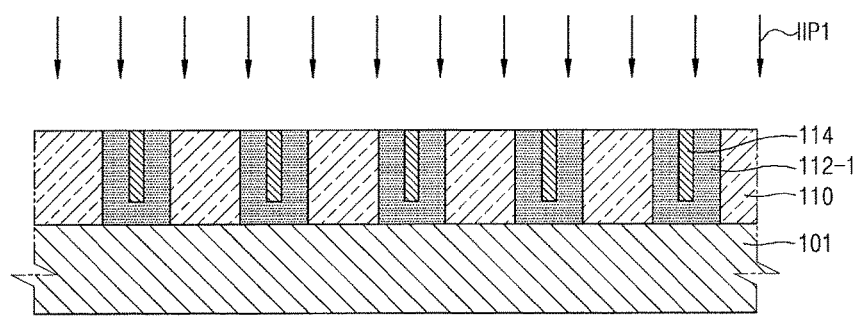
Figure 10B:
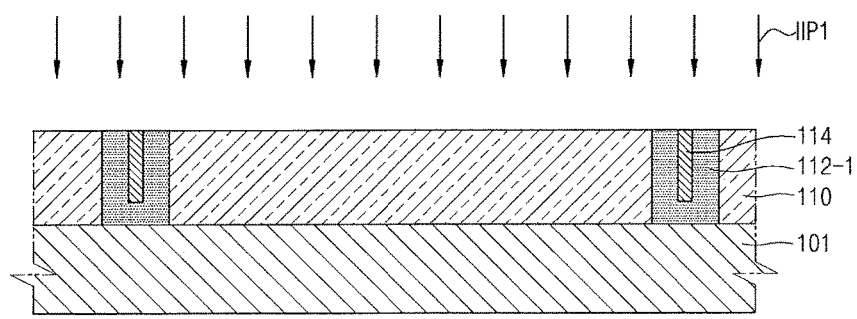

Referring to FIGS. 10A and 10B, a first implant process IIP1 is performed in which the lower insulating layer 110, the first conductive layer 112-1, and the first sacrificial layer 114 are doped with carbon. An upper part of the first conductive layer 112-1 may contain carbon through the first implant process IIP1. Since the first conductive layer 112-1 is doped with carbon, etching may be suppressed in a wet etching process for polysilicon. The wet etching for polysilicon may be performed using, for example, an etchant including ammonia water. The first implant process IIP1 may be performed on the entire substrate 101 without a mask.

Figure 11A:
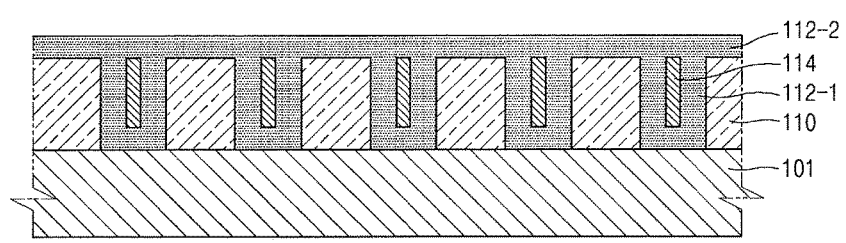
Figure 11B:
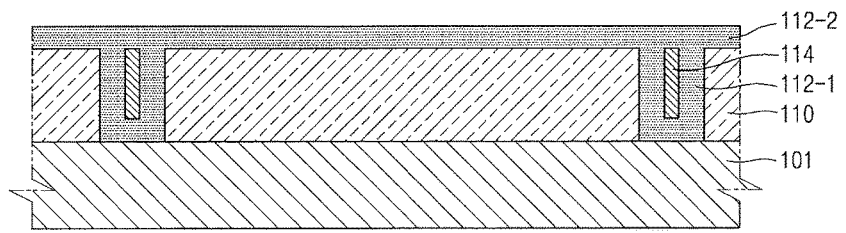

Referring to FIGS. 11A and 11B, after the first implant process IIP1, a second conductive layer 112-2 is formed on the lower insulating layer 110, the first conductive layer 112-1, and the first sacrificial layer 114. The second conductive layer 112-2 may be formed, for example, of polysilicon on the entire substrate 101. The second conductive layer 112-2 may be formed to an appropriate thickness in consideration of a folding structure, in which a portion of the second conductive layer 112-2 is removed and then the gate dielectric layer and the horizontal channel layer are filled therein.

Figure 12A:
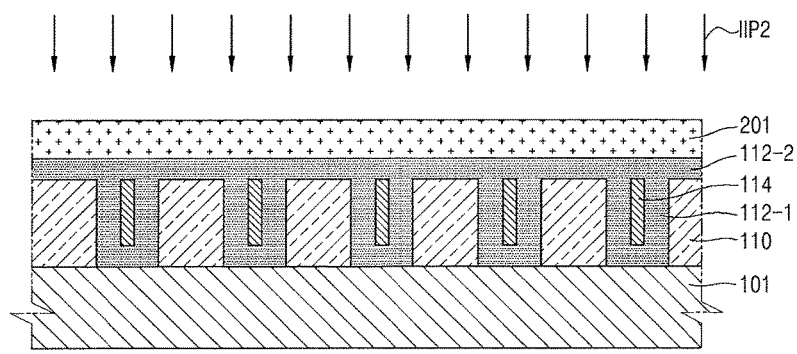
Figure 12B:
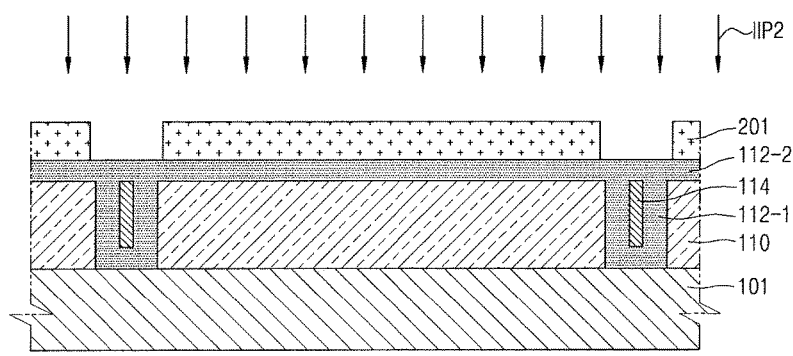
Figure 12C:
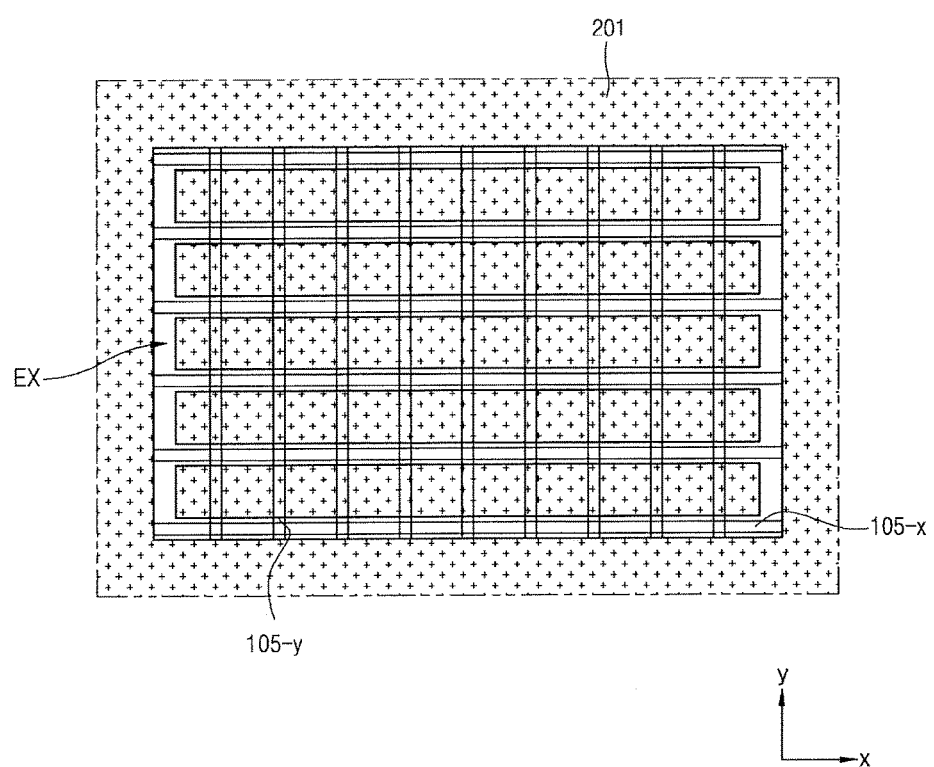

Referring to FIGS. 12A to 12C, a photoresist pattern 201 is formed on the second conductive layer 112-2 through a photolithography process. As shown in FIG. 12C, the photoresist pattern 201 may expose a part corresponding to a word line cut and an expansion region EX outside a cell region. The first lower wiring pattern 105-x may be formed later under the word line cut part.

After the photoresist pattern 201 is formed, a second implant process IIP2 is performed in which the second conductive layer 112-2 is doped with carbon using the photoresist pattern 201 as a mask. Through the second implant process IIP2, only a specific region of the second conductive layer 112-2, for example, the part corresponding to the word line cut and the expansion region EX may be doped with carbon.

Some of the reasons why part of the second conductive layer 112-2 corresponding to the word line cut is doped with carbon in one embodiment. First, in the wet-etching process for polysilicon, the second conductive layer may be maintained in the word line cut part by clarifying an etching boundary. Second, a selection ratio may be increased during the word line cut process. For example, when the second conductive layer 112-2 contains carbon, the selection ratio may increase during a dry etching process for the word line cut. Third, when the second conductive layer is additionally doped with an n-type ion, the second conductive layer may be used as an electron transfer passage.

Some reasons why a part of the second conductive layer 112-2 of the expansion region EX is doped with carbon is as follows. First, polysilicon formed in a peripheral region should be removed. Because the expansion region EX is doped with carbon, the polysilicon in the peripheral region may be easily removed by wet etching without a separate photolithography process. Second, when polysilicon is removed by wet etching using a channel hole, the polysilicon in the expansion region may be prevented from being etched.

Figure 13A:
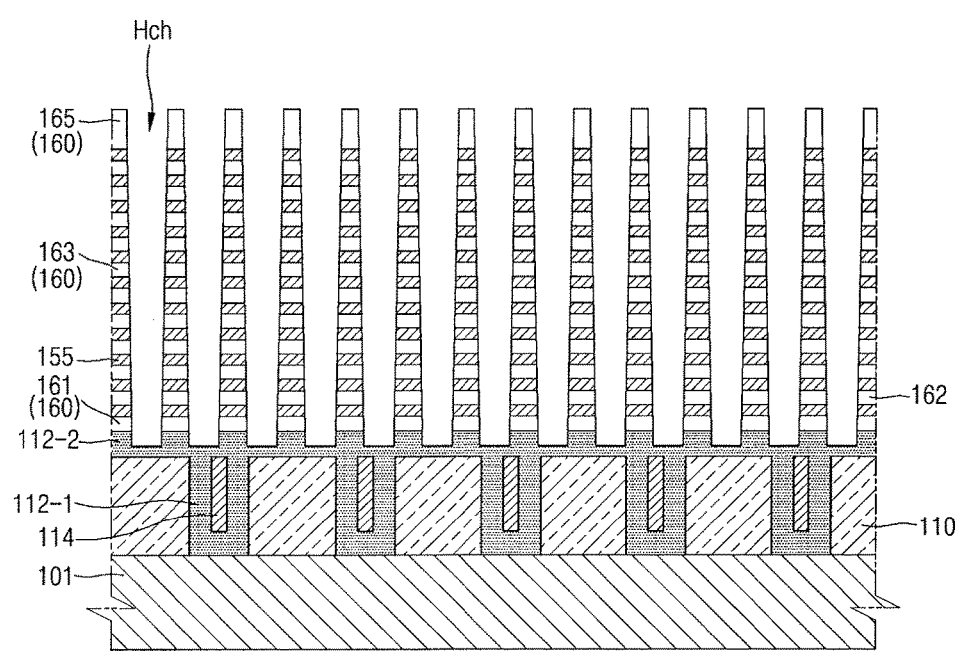
Figure 13B:
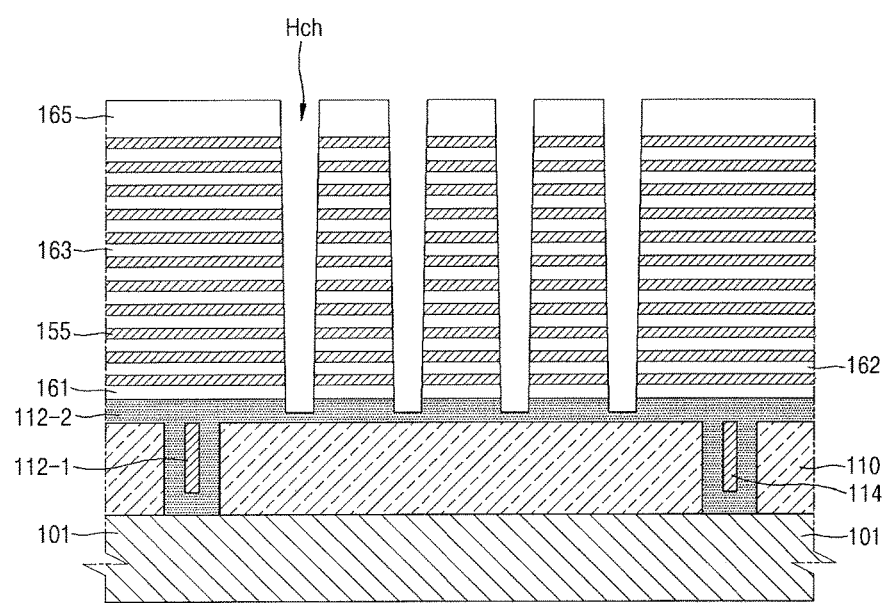

Referring to FIGS. 13A and 13B, after the second implant process IIP2, a mold insulating layer is formed in the cell region. The mold insulating layer is etched to form a plurality of channel holes Hch for exposing the second conductive layer 112-2. The mold insulating layer may be formed on the second conductive layer 112-2 by alternately stacking a first insulating layer 160 and a second sacrificial layer 155. The first insulating layer 160 may be formed, for example, of silicon oxide. The second sacrificial layer 155 may be formed, for example, of silicon nitride. The first insulating layer 160 and the second sacrificial layer 155 may be formed of different materials in another embodiment.

The first insulating layer 160 may correspond to the interlayer insulating layer 160 in FIG. 2, and thus may include a bottom insulating layer 161, an insulating layer 162 under a dummy gate electrode, cell insulating layers 163, a top insulating layer 165, etc. Subsequently, the second sacrificial layer 155 may be replaced with a metal and then changed to a gate electrode. As shown, the insulating layer 162 under the dummy gate electrode may be formed to substantially the same thickness as the cell insulating layers 163. For reference, for the existing VNAND, the insulating layer under the dummy gate electrode is formed to be comparatively thick in order for the SEG process. However, since the SEG process is not performed during the memory device fabrication process according to an embodiment, the insulating layer under the dummy gate electrode may be formed to substantially the same thickness as the cell insulating layers 163.

Before the channel hole Hch is formed, a word line pad may be formed in a stepwise structure of the expansion region EX (e.g., see FIG. 12C). During the word line pad process, polysilicon in the peripheral region may be removed by wet etching. As described above, the polysilicon in the peripheral region may be easily removed by wet etching, without a separate photolithography process, by doping a part of the second conductive layer 112-2 in the expansion region with carbon.

In addition, before the channel hole Hch is formed, an insulating layer is formed to entirely cover the mold insulating layer and its peripheral region. Then, a planarization process may be performed. For the memory device fabrication process according to an embodiment, since there is no dent between the expansion region EX (e.g., see FIG. 12C) and the peripheral region, a chemical-mechanical planarization (CMP) process for the planarization may be immediately performed without an additional etching process.

Figure 14A:
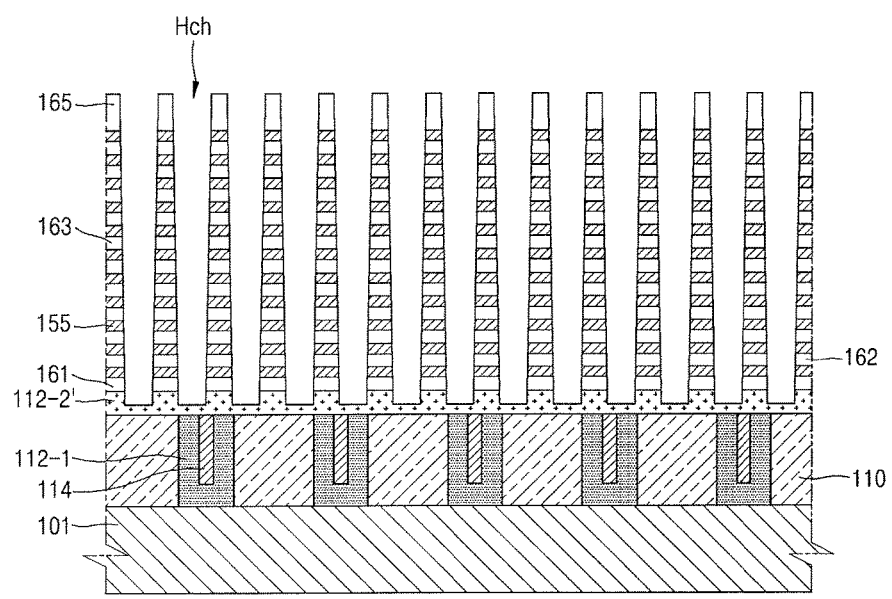
Figure 14B:
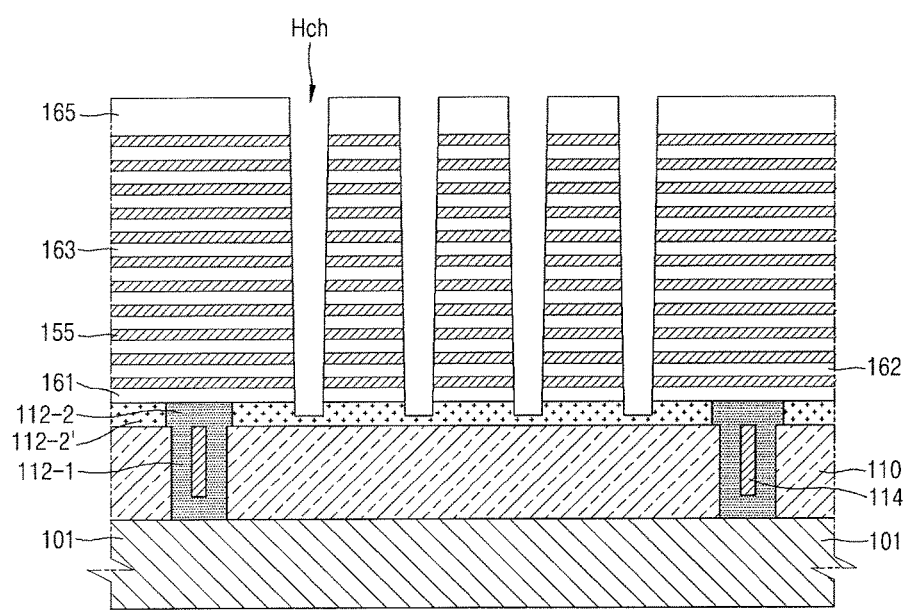

Referring to FIGS. 14A and 14B, a portion of the second conductive layer 112-2 exposed through the channel hole Hch is removed by wet etching. For example, since the second conductive layer 112-2 is formed of polysilicon, the wet etching for the second conductive layer 112-2 may be performed using an etchant including ammonia water. In FIGS. 14A and 14B, a part 112-2' that is hatched differently from before indicates the remaining part of the second conductive layer 112-2, which is recessed with respect to the cross section by removing a part of the second conductive layer 112-2 adjacent to the channel hole Hch by wet etching. As shown in FIG. 14B, a part of the second conductive layer 112-2 doped with carbon is retained rather than being removed and thus is hatched in the same manner as before.

Figure 15A:
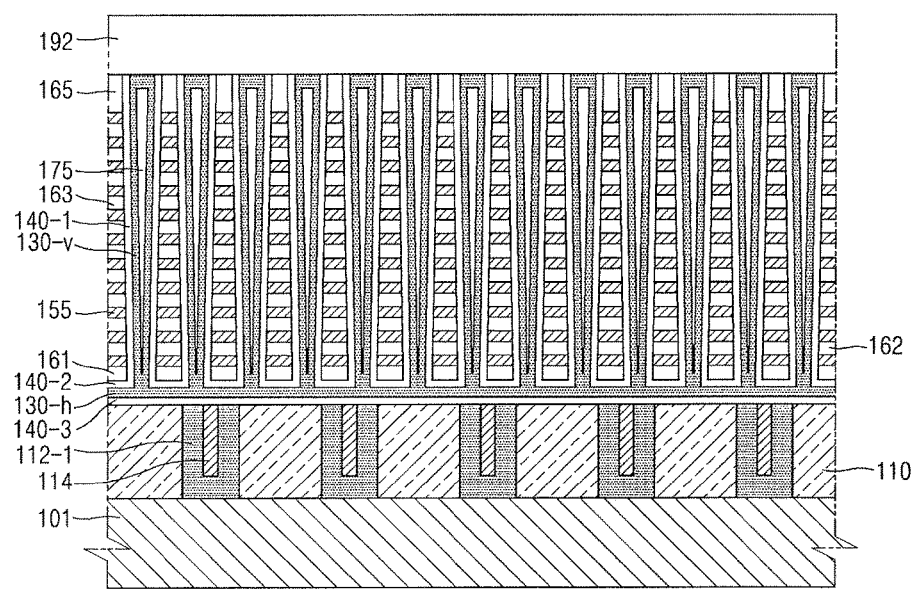
Figure 15B:
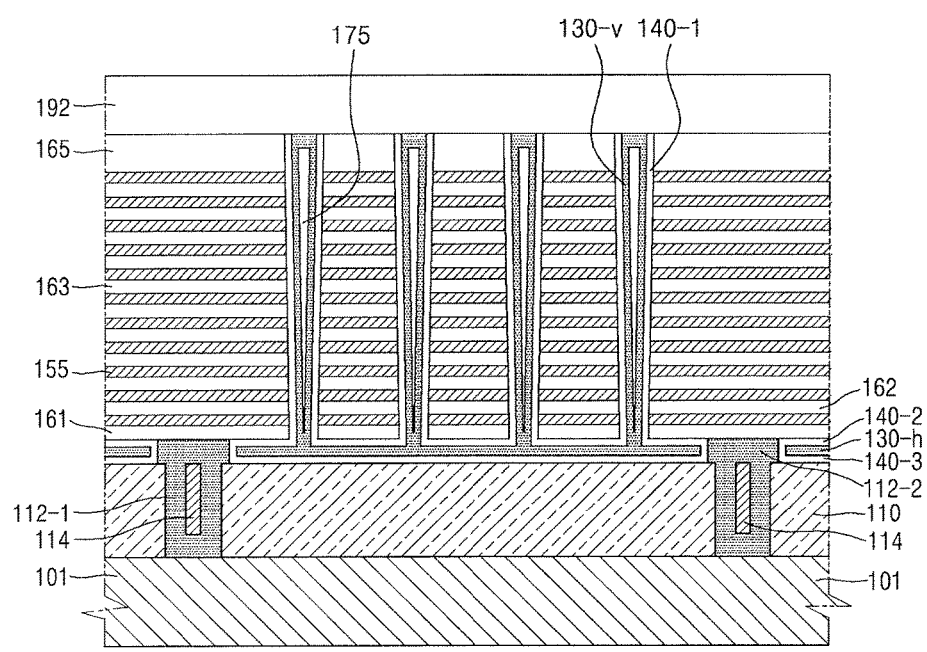

Referring to FIGS. 15A and 15B, the gate dielectric layer 140 and the channel conductive layer 130-v or 130-h are formed in the part from which the second conductive layer 112-2 is removed and the channel hole Hch. The channel conductive layer 130-v or 130-h may include a vertical channel layer 130-v formed vertically in the channel hole Hch and a horizontal channel layer 130-h formed horizontally in the part from which the second conductive layer 112-2 is removed. The channel conductive layer 130-v or 130-h may be formed of polysilicon. The horizontal channel layer 130-h may include the channel conductive layer formed horizontally and the remaining part of the second conductive layer 112-2.

The gate dielectric layer 140 may include a first gate dielectric layer 140-1 formed vertically along a side wall of the vertical channel layer 130-v, a second gate dielectric layer 140-2 over the horizontal channel layer 130-h, and a third gate dielectric layer 140-3 under the horizontal channel layer 130-h.

A buried insulating layer 175 may be formed in the channel hole Hch, and the vertical channel layer 130-v may be connected at the top of the buried insulating layer 175. A connection part of the vertical channel layer 130-v may be formed through a process of forming a groove in the channel hole Hch and then filling the groove with polysilicon after the buried insulating layer 175 is formed. A wiring insulating layer 192 may be formed on the top insulating layer 165, the first gate dielectric layer 140-1, and the vertical channel layer 130-v.

Figure 16A:
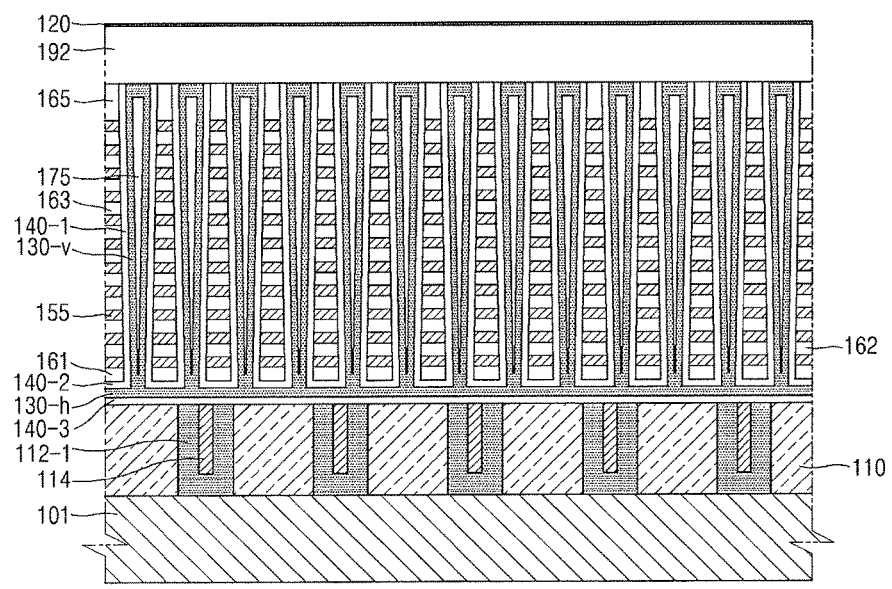
Figure 16B:
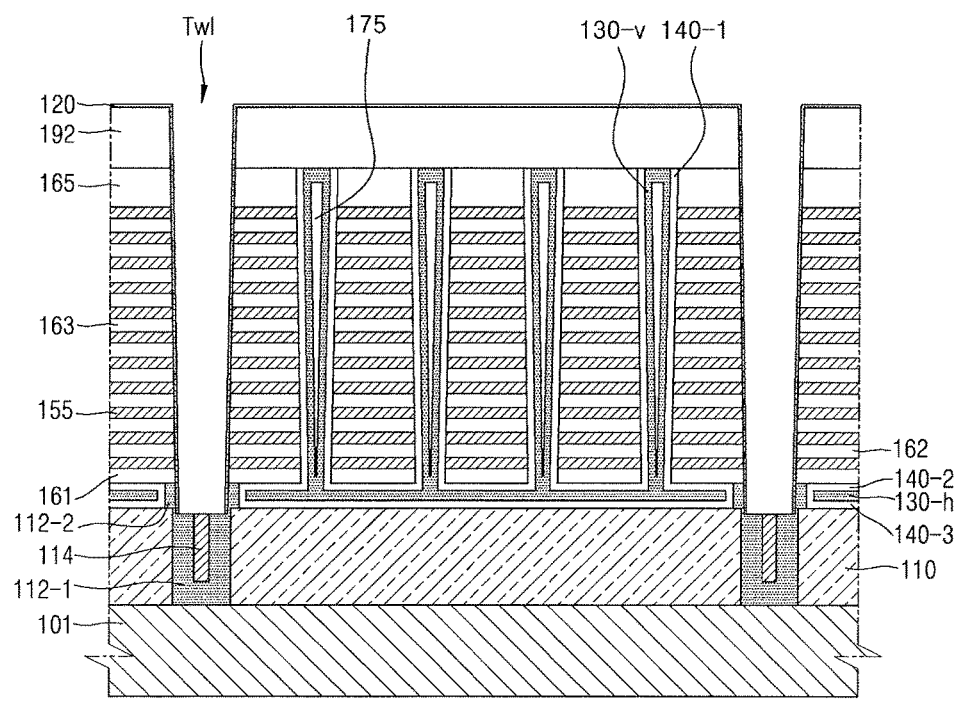
Figure 16C:
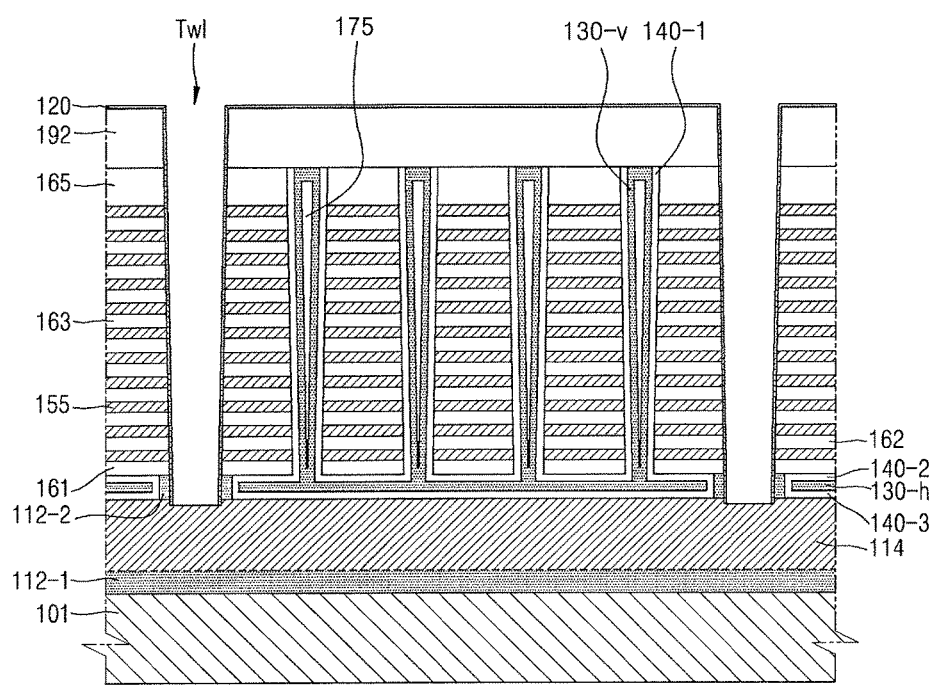

Referring to FIGS. 16A to 16C, the wiring insulating layer 192 and the mold insulating layer is etched to form separation trenches Twl for exposing the first conductive layer 112-1 and the first sacrificial layer 114. The separation trenches Twl may be formed in the structure that extends in the first direction (x direction) and are spaced apart from one another in the second direction (y direction). Each of the separation trenches Twl may correspond to a word line cut.

A protective layer 120 may be thinly formed on a side wall of the separation trench and the wiring insulating layer 192. The protective layer 120 may be formed, for example, of polysilicon. The protective layer 120 may protect the second sacrificial layer 155 of the mold insulating layer from being etched when the first sacrificial layer 114 thereunder is removed through a pull-back process.

As shown, the protective layer 120 may not be formed on the first conductive layer 112-1 and the first sacrificial layer 114. The protective layer 120 may be formed, for example, in the following process. First, before the separation trench Twl is formed, a first protective layer is formed on the wiring insulating layer 192. Subsequently, the separation trench Twl is formed through a photolithography process, and a second protective layer is formed on the bottom surface and the side wall of the separation trench Twl and the first protective layer. Subsequently, the second protective layer is removed from the bottom surface of the separation trench Twl and the first protective layer through an etch-back (E/B) process.

Through removal of the second protective layer, the first conductive layer 112-1 and the first sacrificial layer 114 are exposed at the bottom surface of the separation trench Twl. However, the top of the wiring insulating layer 192 may not be exposed because the first protective layer is formed on the wiring insulating layer 192. As a result, the protective layer on the wiring insulating layer 192 may be formed as the first protective layer, and the protective layer on the side wall of the separation trench Twl may be formed as the second protective layer.

Figure 17A:
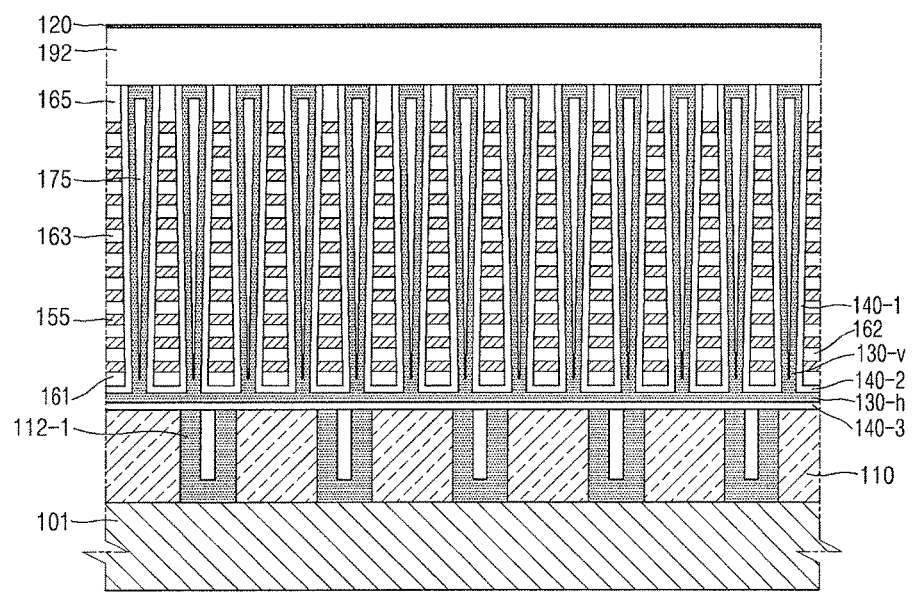
Figure 17B:
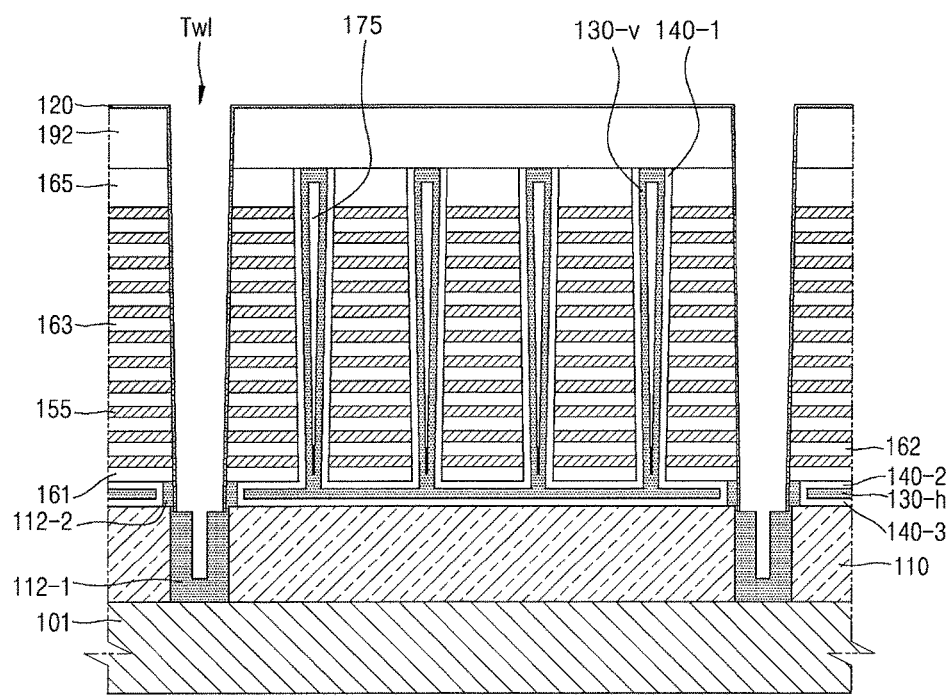
Figure 17C:
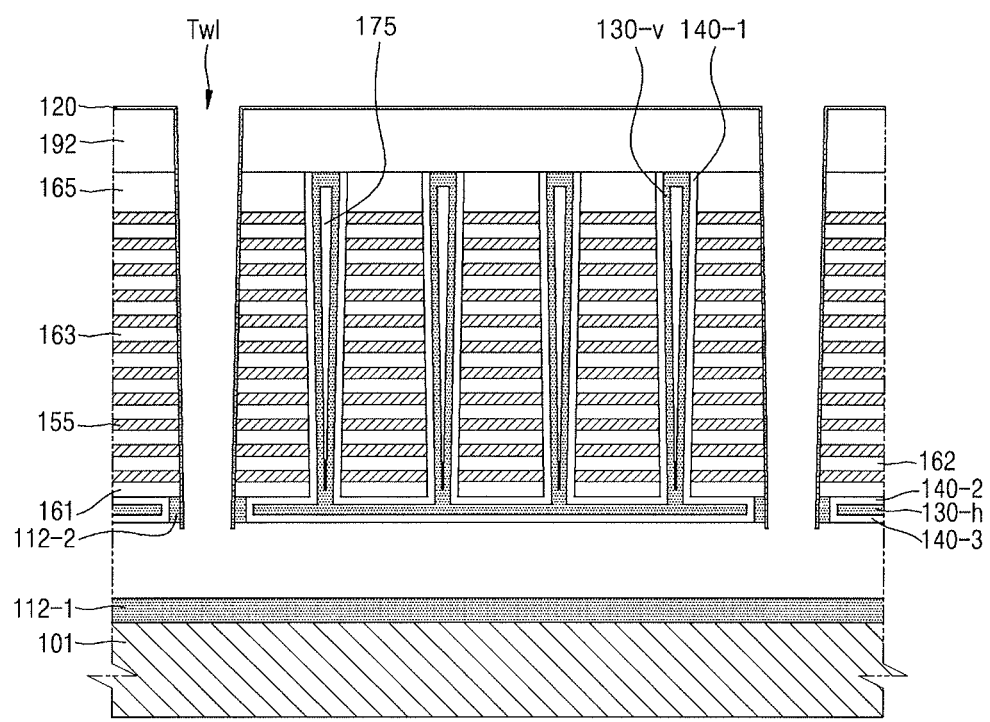

Referring to FIGS. 17A to 17C, the first sacrificial layer exposed through the separation trench Twl is removed through the pull-back process. Since the first sacrificial layer 114 may have a connection structure like the first conductive layer 112-2, all of the first sacrificial layer 114 may be removed through the separation trench Twl. For example, although FIG. 16A shows that the first sacrificial layer 114 is not in contact with the separation trench Twl, the first sacrificial layer 114 may be removed through the separation trench Twl disposed in front of or behind the plane of the paper. Accordingly, as shown in FIG. 17A, the first sacrificial layer 114 may be removed.

According to a sectional structure of FIG. 17C, when the first sacrificial layer 114 is removed, a part of the lower insulating layer 110 may be exposed. However, the part of the lower insulating layer 110 is omitted in order to clearly show that the first sacrificial layer 114 has been removed.

Figure 18A:
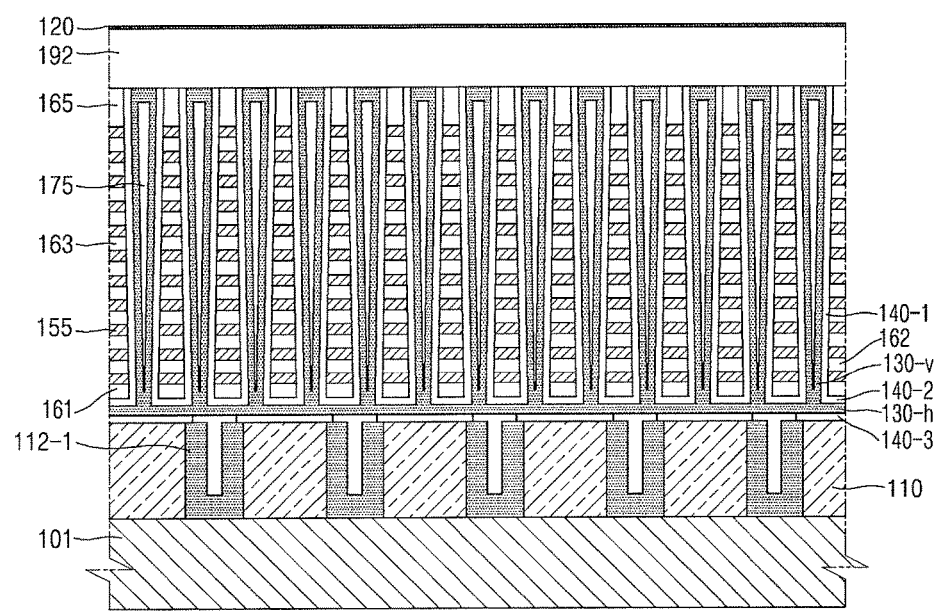
Figure 18B:
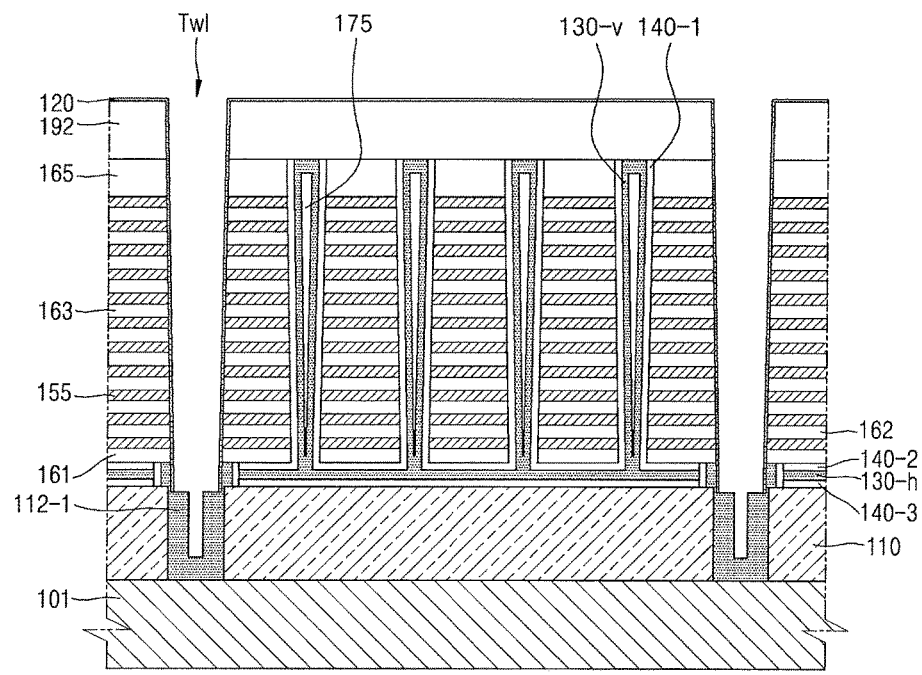
Figure 18C:
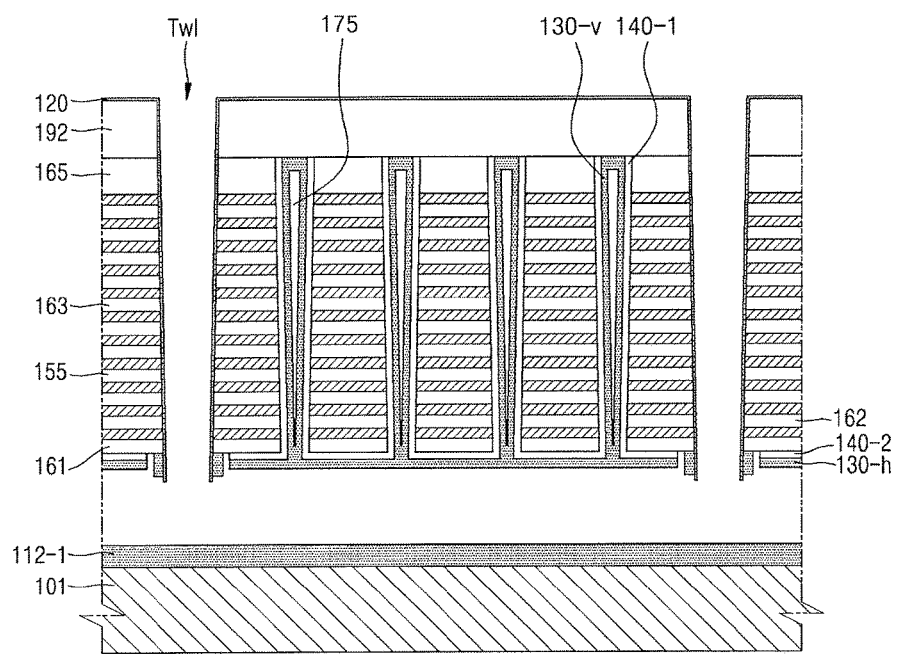

Referring to FIGS. 18A to 18C, a part of the gate dielectric layer 140 exposed through the removal of the first sacrificial layer 114 is removed. Most of the removed gate dielectric layer 140 may be a part of the third gate dielectric layer 140-3. A portion of the second gate dielectric layer 140-2 may be removed.

For example, in FIGS. 18A and 18C, a part of the third gate dielectric layer 140-3 in contact with the first sacrificial layer 114 has been removed and a part of the third gate dielectric layer 140-3 connected with the second gate dielectric layer 140-2 has been removed. Although FIG. 18B shows that the second gate dielectric layer 140-2 and the third gate dielectric layer 140-3 are not in contact with the part from which the first sacrificial layer 114 has been removed, the part from which the first sacrificial layer 114 has been removed may be positioned in front of or behind the plane of the paper, and thus a certain part may be removed.

Figure 19A:
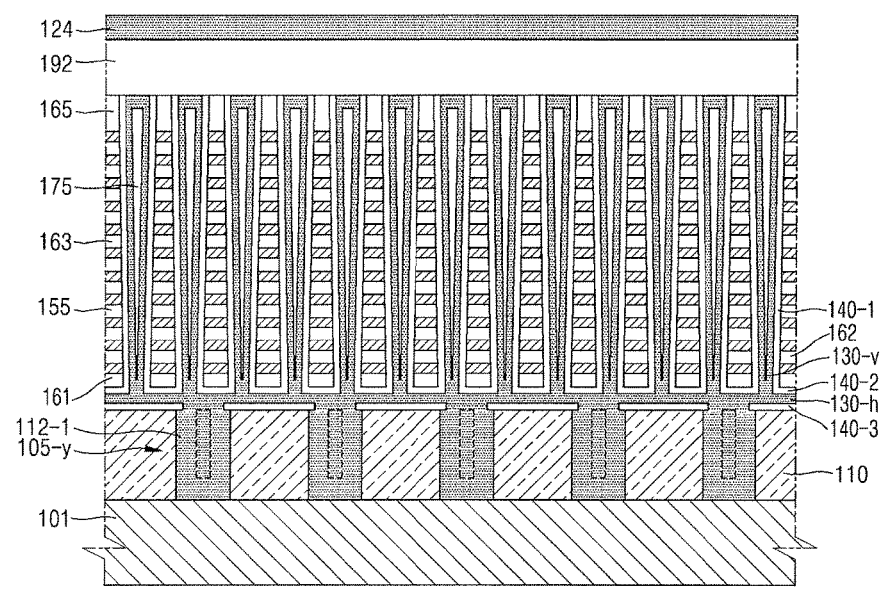
Figure 19B:
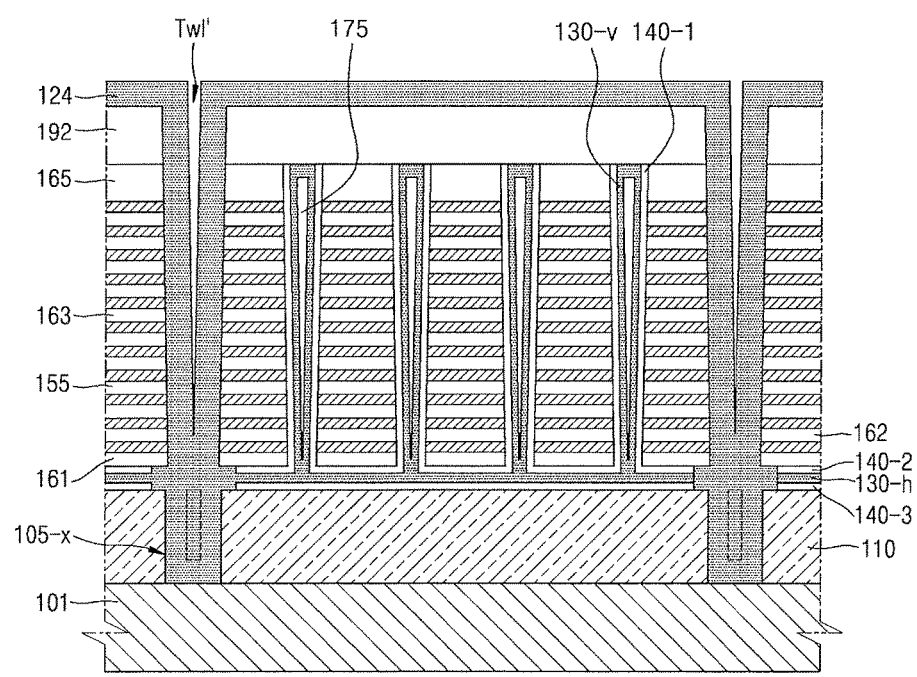
Figure 19C:
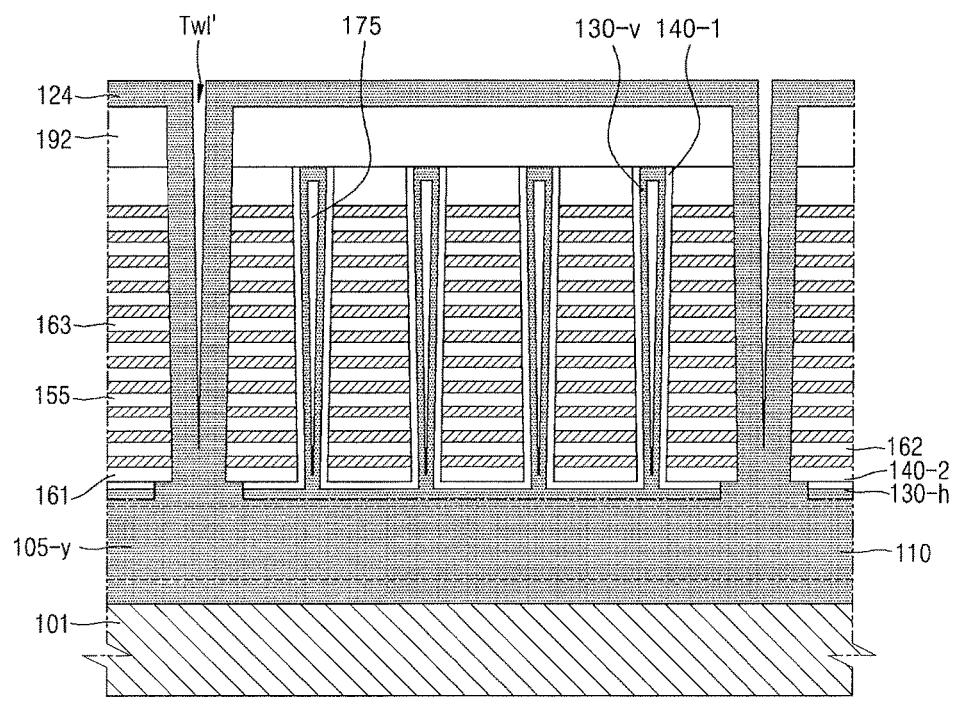

Referring to FIGS. 19A to 19C, a replacement conductive layer 124 is formed in a part from which the first sacrificial layer 114 and the gate dielectric layer 140 have been removed through a separation trench Twl'. The replacement conductive layer 124 may be formed, for example, of polysilicon. As shown, the replacement conductive layer 124 may be formed on the wiring insulating layer 192 and a side wall of the separation trench Twl'. The replacement conductive layer 124 includes the protective layer 120 on the wiring insulating layer 192 and the side wall of separation trench Twl.

The replacement conductive layer 124 may be formed in the same method as described above to form the channel conductive layer 130-v or 130-h. For example, the replacement conductive layer 124 may be formed, for example, through a gap-fill process using a folding principle. In some cases, the replacement conductive layer 124 may also be formed through an SEG process.

Figure 20A:
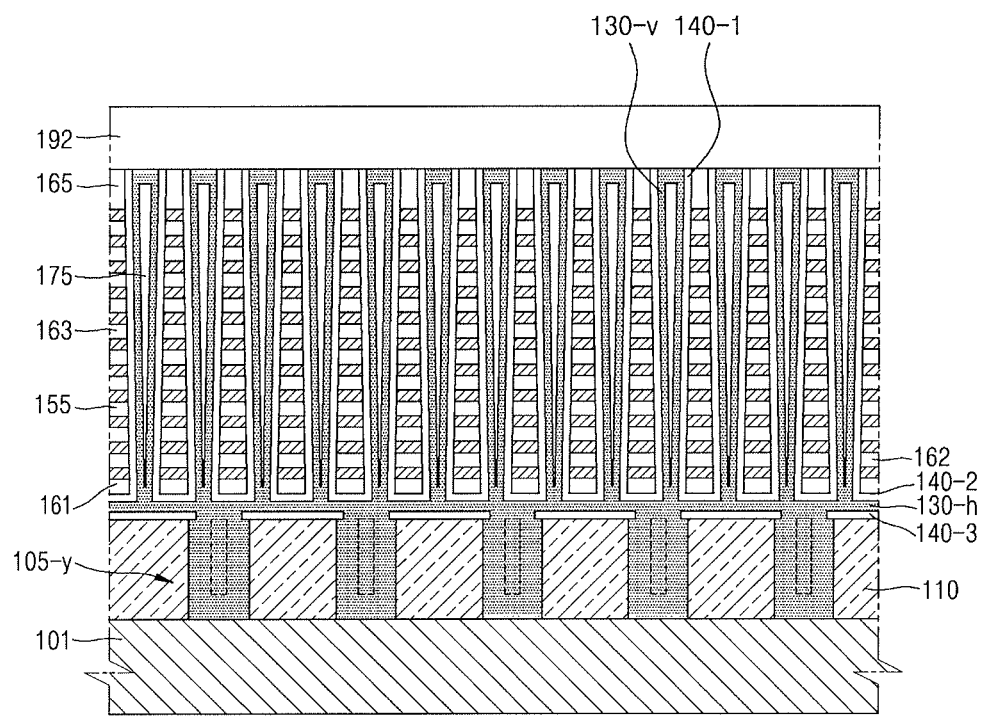
Figure 20B:
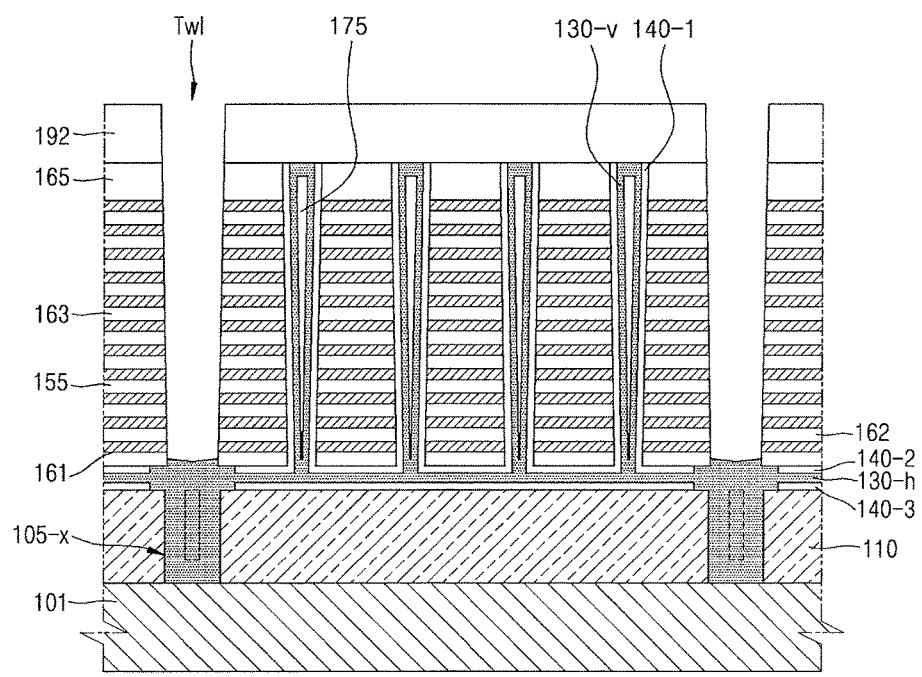
Figure 20C:
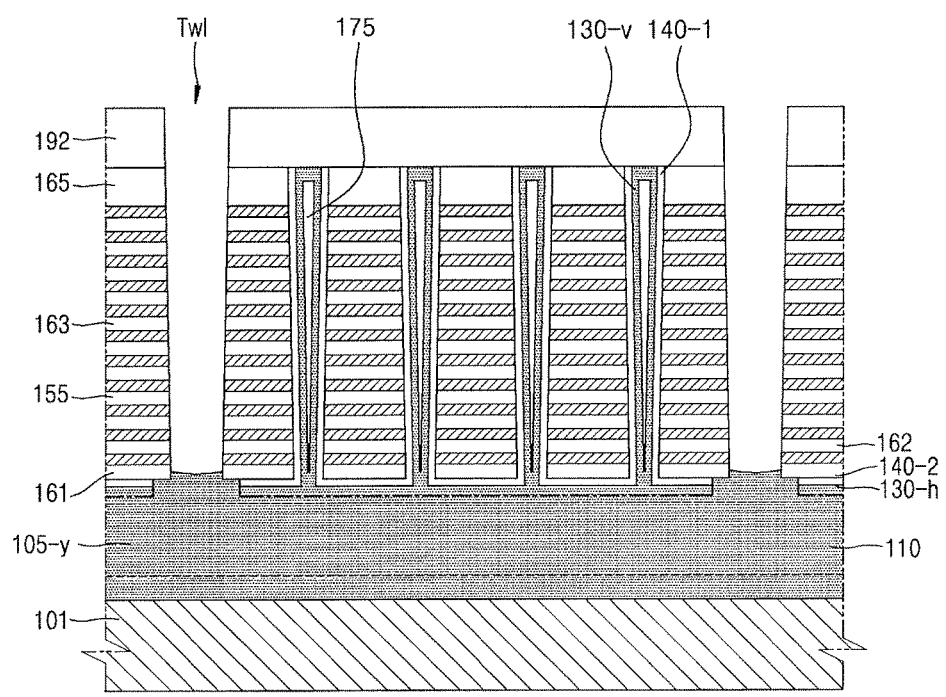

Referring to FIGS. 20A-20C, the replacement conductive layer 124 in the separation trench Twl is removed to a certain depth. For example, the replacement conductive layer 124 is removed to expose at least a portion of a side wall of the bottom insulating layer 161. The side wall of the second sacrificial layer 155 may be exposed through the removal of the replacement conductive layer 124. In addition, a structure of the connection region IA of FIGS. 4A-4C may be completed through removal of the replacement conductive layer 124.

Subsequently, the memory device 100 of FIGS. 2-4C may be completed by performing a process that is substantially the same as the existing VNAND process. For example, second sacrificial layer 155 exposed through the separation trench Twl is removed and a metal layer is formed in the separation trench Twl and a part from which the second sacrificial layer 155 have been removed. The metal layer may be formed, for example, of tungsten. Subsequently, a plurality of gate electrodes 150 are formed by anisotropically etching a part corresponding to separation trench Twl and maintaining the metal layer only in the part from which second sacrificial layer 155 has been removed.

After the gate electrodes 150 are formed, an impurity region is formed by implanting impurities into the lower wiring pattern 105 through the separation trench Twl. The impurity region may be a common source region. Next, a separation region 180 including a metal layer 182 and an insulating spacer 184 is formed on the lower wiring pattern 105. The metal layer 182 may correspond to a common source line. A metal silicide (e.g., cobalt silicide) may also be formed between the metal layer 182 and the lower wiring pattern 105.

Next, a buried insulating layer is formed on the separation region 180 in the separation trench Twl. The buried insulating layer may be included as a portion of the wiring insulating layer 192. Through a photolithography process and an etching process, a contact plug 195 (e.g., see FIG. 4A) in contact with the vertical channel layer 130-v is formed through the wiring insulating layer 192. A bit line 193 (e.g., see FIG. 4A) connected to the contact plug and extending in the second direction (y direction) is formed on the wiring insulating layer 192.

In the memory device fabrication method according to an embodiment, the wiring insulating layer 192 is formed after the gate dielectric layer 140 and the channel conductive layer 130-v or 130-h are formed. In one embodiment, the wiring insulating layer 192 may also be formed after the separation region 180 is formed. In this case, a separate buried insulating layer may not be formed on the separation region 180.

Figure 21A:
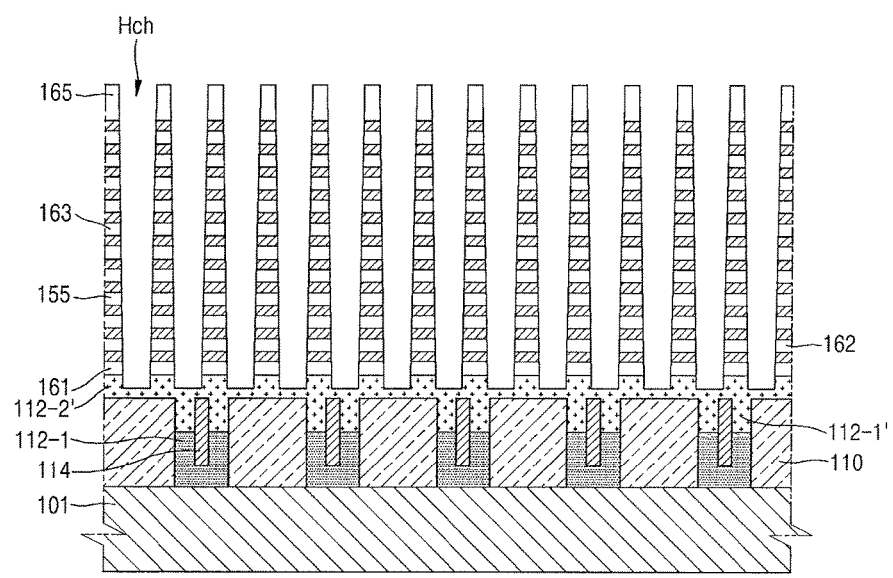
FIGS. 21A-23C illustrate various stages of an embodiment of a fabrication method for the vertical non-volatile memory device in FIG. 5A-5C.
Figure 21B:
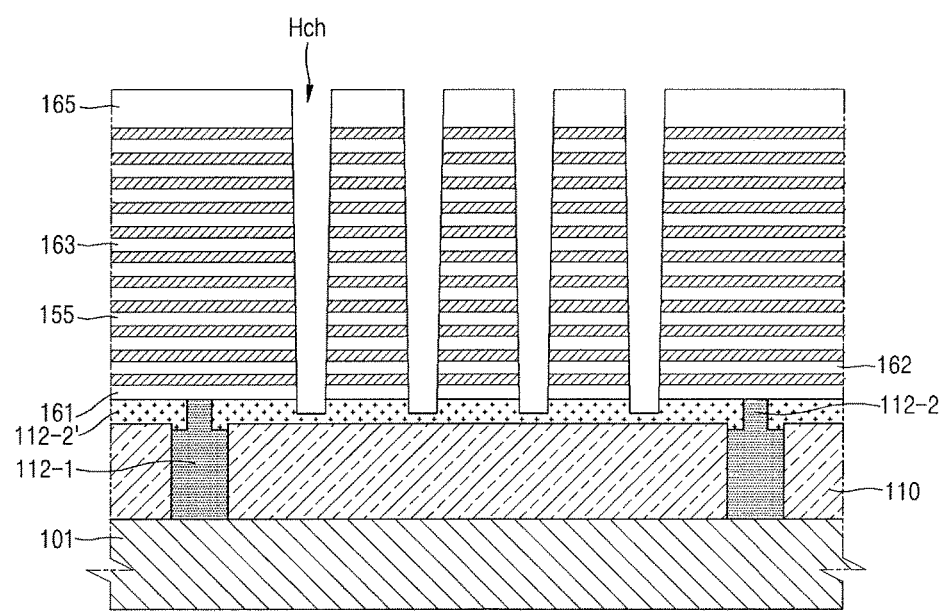
Figure 22A:
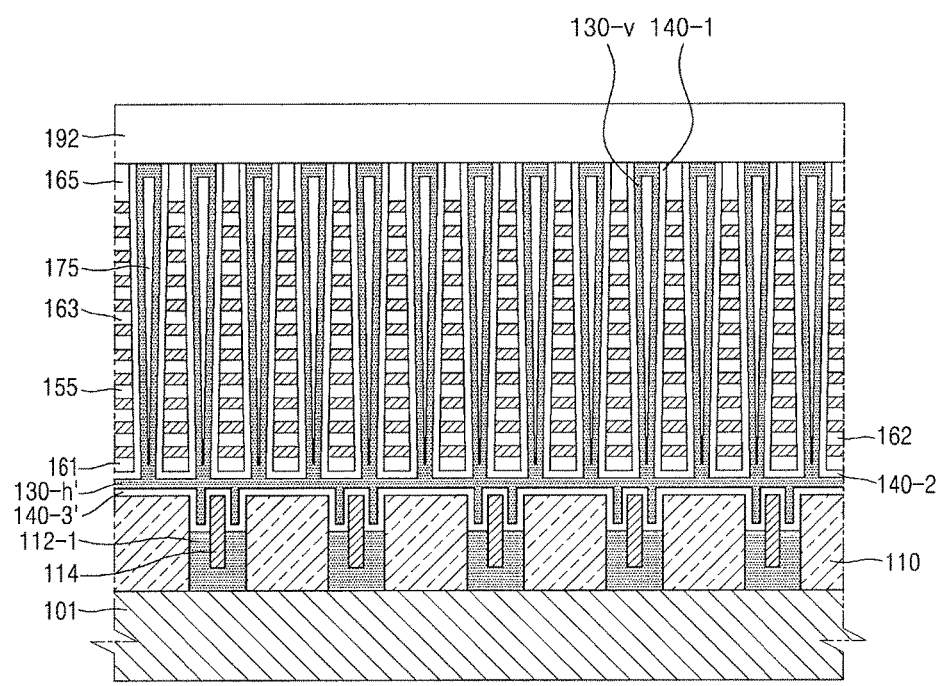
Figure 22B:
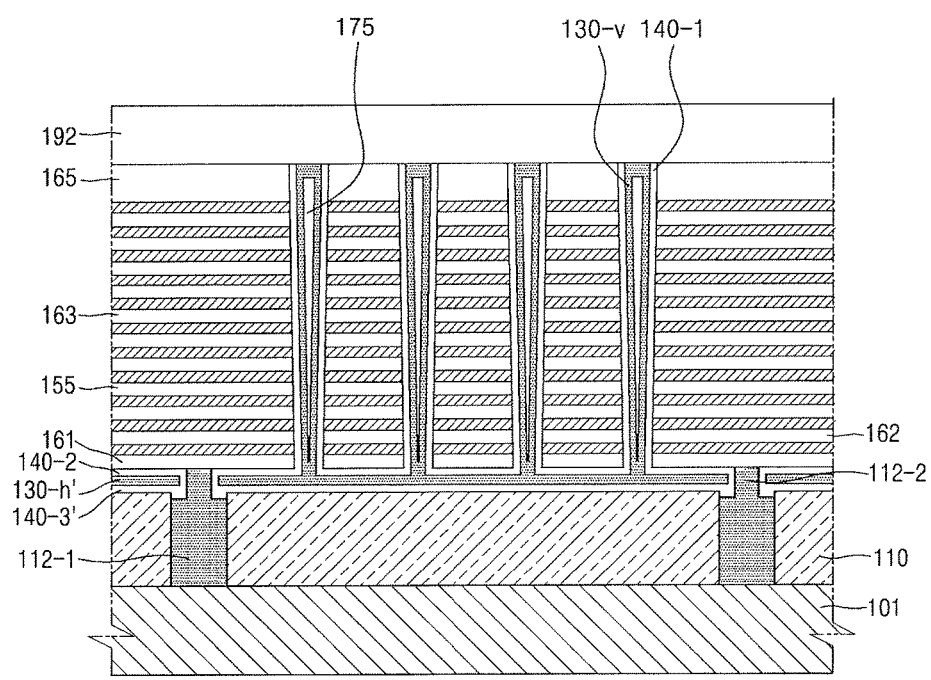
Figure 23A:
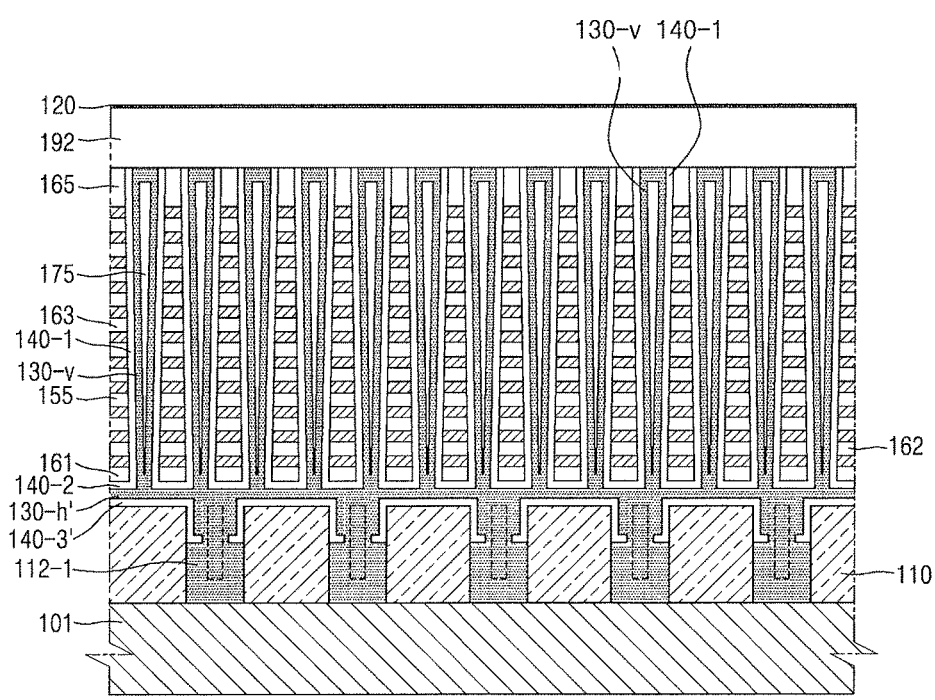
Figure 23B:
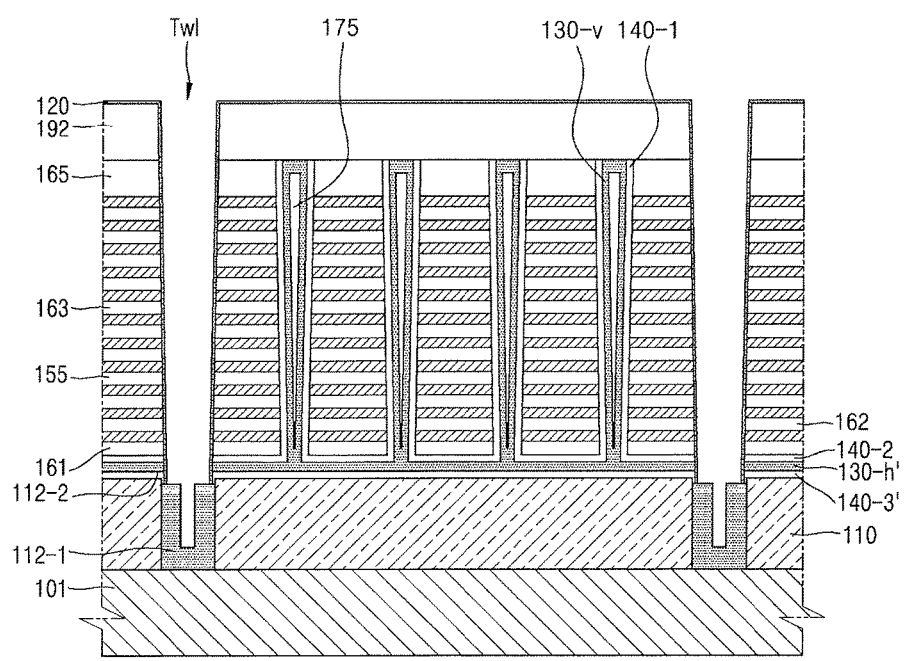
Figure 23C:
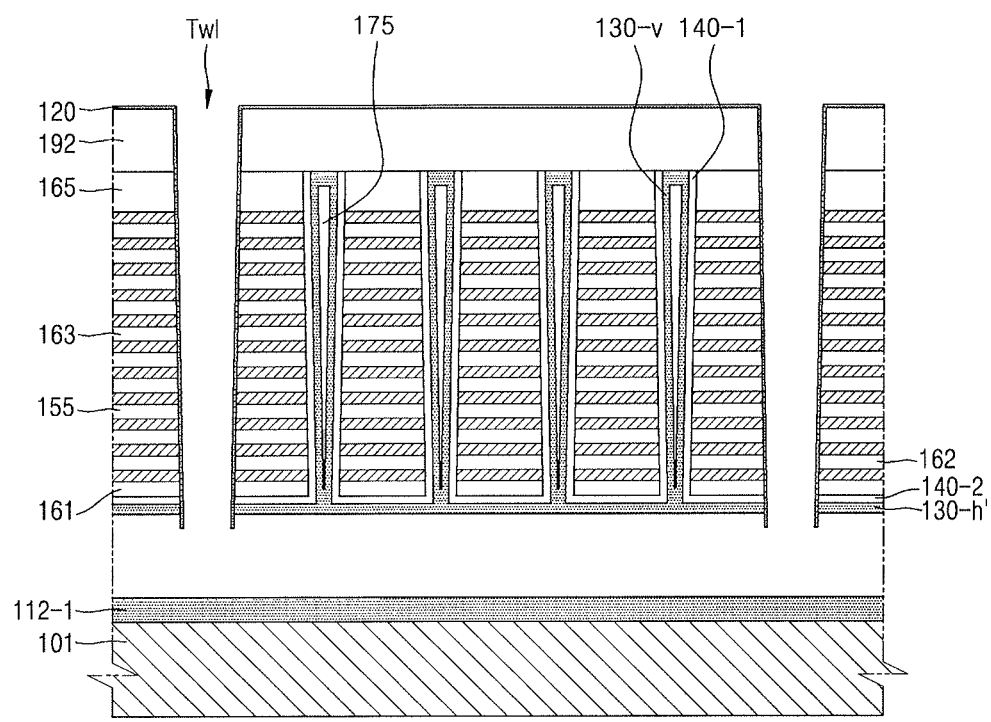

FIGS. 21A-23C illustrate cross-sectional views of an embodiment of a method for fabricating the vertical non-volatile memory device in FIGS. 5A-5C. FIGS. 21A and 22A correspond to the cross-sectional view of FIG. 4A. FIGS. 21B and 22B correspond to the cross-sectional view of FIG. 4B. FIG. 23C corresponds to the cross-sectional view of FIG. 4C.

Referring to FIGS. 21A and 21B, the processes of FIGS. 8A-13B are sequentially performed, but the first implant process IIP1 and the second implant process IIP2 may be omitted. For example, the processes of FIGS. 10A, 10B, and 12A-12C may be omitted. Subsequently, as shown in FIGS. 14A and 14B, a portion of the first conductive layer 112-1 and a portion of the second conductive layer 112-2 are removed through the channel hole Hch by wet etching. In FIGS. 21A and 21B, parts 112-1' and 112-2' (that are hatched differently from before) indicate the remaining part of the first conductive layer 112-1 and the remaining part of the second conductive layer 112-2 (which are recessed with respect to the cross sections), respectively.

Unlike FIGS. 14A and 14B, a portion of the second conductive layer 112-2 corresponding to the word line cut region and an upper part of the first conductive layer 112-1 are etched to be removed. This is because carbon is not doped by omitting the first implant process and the second implant process. Thus, an upper portion of the first conductive layer 112-1 and a part of the second conductive layer 112-2 corresponding to the word line cut are removed through a wet etching process.

Referring to FIGS. 22A and 22B, the gate dielectric layer 140 and the channel conductive layer 130-v or 130-h are formed in the channel hole Hch and a part from which the first conductive layer 112-1 and the second conductive layer 112-2 have been removed. Since the shape of the part from which the first conductive layer 112-1 and the second conductive layer 112-2 have been removed is different from that of FIGS. 14A and 14B, the shapes of the gate dielectric layer 140 and the channel conductive layer 130-v or 130-h may be different from those in FIGS. 15A and 15B.

For example, as shown in FIG. 22A, a horizontal channel layer 130-h' may include a part that extends vertically downward at a part of the first conductive layer 112-1. In addition, the third gate dielectric layer 140-3' may include a part that surrounds the extended part of the horizontal channel layer 130-h'. In addition, as shown in FIG. 22B, in the first conductive layer 112-1 and the second conductive layer 112-2 corresponding to the word line cut, the horizontal channel layer 130-h' may have a structure in which the horizontal channel layer 130-h' extends into the first conductive layer 112-1 in the second direction (y direction). Also, the second gate dielectric layer 140-2 and the third gate dielectric layer 140-3' surround the horizontal channel layer 130-h. For example, the third gate dielectric layer 140-3' may have a structure that extends slightly downward in a part that overlaps the first conductive layer 112-1.

Referring to FIGS. 23A-23C, a separation trench Twl is formed by performing a process such as in FIGS. 16A to 17C, and a first sacrificial layer 114 exposed through removal of the separation trench Twl. Subsequently, a gate dielectric layer 140 exposed through removal of the first sacrificial layer 114. For example, as shown in FIG. 23A, a third gate dielectric layer 140-3' that surrounds the extended part of the horizontal channel layer 130-h' may be removed. For example, since the extended part of the horizontal channel layer 130-h' is disposed at different sides of the first sacrificial layer 114, and also a third gate dielectric layer 140-3' between the extended parts is exposed by removing the first sacrificial layer 114, the third gate dielectric layer 140-3' therebetween may be removed.

As shown in FIGS. 23B and 23C, portions of the horizontal channel layer 130-h', the second gate dielectric layer 140-2, and the third gate dielectric layer 140-3' are removed while the separation trench Twl is formed. Thus, a structure may formed in which sides of the horizontal channel layer 130-h', the second gate dielectric layer 140-2, and the third gate dielectric layer 140-3' contact an outer surface of the protective layer 120.

Subsequently, when the processes of FIGS. 19A-20C are performed, the memory device 100a of FIGS. 5A-5C may be fabricated. In the memory device 100a in FIGS. 5A-5C, the extended part of horizontal channel layer 130-h' is in a contact layer 107-c' rather than horizontal channel layer 130-h.

When the replacement conductive layer 124 is formed in the part from which the first sacrificial layer 114 and the third gate dielectric layer 140-3' have been removed through a gap-fill process using a folding principle, the part from which the first sacrificial layer 114 and the third gate dielectric layer 140-3' have been removed should have a width less than the bottom surface of the separation trench Twl. For example, the sum of the width of the first sacrificial layer 114 and the width of the third gate dielectric layer 140-3' at different sides of the first sacrificial layer 114 should be less than the width of the bottom surface of the separation trench Twl. This is because, when the sum of the width of the first sacrificial layer 114 and the width of the third gate dielectric layer 140-3' at different sides of the first sacrificial layer 114 is greater than the width of the bottom surface of the separation trench Twl, the bottom surface of the separation trench Twl is filled through folding and then blocked before the part from which the first sacrificial layer 114 and the third gate dielectric layer 140-3' have been removed are filled with the replacement conductive layer 124. Thus, the replacement conductive layer 124 cannot be supplied to the part from which the first sacrificial layer 114 and the third gate dielectric layer 140-3' have been removed.

Moreover, the memory device 100b in FIG. 6 may be fabricated by further forming a trench corresponding to the third lower wiring pattern 105-xa in the processes of FIGS. 8A-8C and performing subsequent processes.

In accordance with one or more of the aforementioned embodiments, a vertical non-volatile memory device has a structure in which a vertical channel layer forming memory cells is electrically connected with a substrate through a lower wiring pattern formed on the substrate. Thus, a selective epitaxial growth (SEG) process for connecting the vertical channel layer to the substrate, and a process for etching a gate dielectric layer in a bottom surface of a channel hole, which are performed for existing VNANDs, may be omitted. Accordingly, the vertical non-volatile memory device and a method for fabricating such a device may have low fabrication costs, may have lowering a process difficulty levels, higher integration, and enhanced reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A vertical non-volatile memory device, comprising:
   a substrate including a cell region;
   a lower insulating layer on the substrate;
   a lower wiring pattern in the cell region having a predetermined pattern and connected to the substrate through the lower insulating layer;
   a plurality of vertical channel layers extending in a vertical direction relative to a top surface of the substrate in the cell region, spaced apart from one another in a horizontal direction relative to the top surface of the substrate, and electrically connected to the lower wiring pattern;
   a horizontal channel layer extending in the horizontal direction, the horizontal channel layer connecting bottoms of the plurality of vertical channel layers to the lower wiring pattern; and
   a plurality of gate electrodes stacked alternately with interlayer insulating layers in the cell region in the vertical direction along a side wall of a vertical channel layer and extending in a first direction along the horizontal direction.

2. The device as claimed in claim 1, further comprising:
   a gate dielectric layer is between each of the interlayer insulating layers and each of the plurality of vertical channel layers and between each of the plurality of gate electrodes and each of the plurality of vertical channel layers, wherein the gate dielectric layer extends between the horizontal channel layer and a bottom interlayer insulating layer in the horizontal direction.

3. The device as claimed in claim 1, further comprising:
   a plurality of separation regions extending in the first direction and spaced apart in a second direction intersecting the first direction, the separating regions separating the gate electrodes from one another in the second direction, wherein:
   the lower wiring pattern includes:
   first lower wiring patterns under the separation regions, spaced apart from one another in the second direction with the lower insulating layer therebetween, and extending in the first direction, and
   second lower wiring patterns spaced apart from one another in the first direction with the lower insulating layer therebetween and extending in the second direction,
   wherein each of the second lower wiring patterns is in contact with the horizontal channel layer among the first lower wiring patterns, and wherein a gate dielectric layer is between the horizontal channel layer and the lower insulating layer.

4. The device as claimed in claim 3, wherein:
   the lower wiring pattern, the vertical channel layer, and the horizontal channel layer include polysilicon; and
   the gate dielectric layer includes oxide-nitride-oxide (ONO).

5. The device as claimed in claim 3, wherein:
   an upper wiring layer is on the first lower wiring patterns;
   a contact layer in contact with the horizontal channel layer and on the second lower wiring patterns;
   the upper wiring layer has a width equal to or greater than the first lower wiring patterns in the second direction; and
   the contact layer has a width less than or equal to the second lower wiring patterns in the first direction.

6. The device as claimed in claim 5, wherein an upper portion of the lower wiring pattern and the upper wiring layer include carbon.

7. The device as claimed in claim 1, wherein:
   the lower wiring pattern is a line pattern or a mesh pattern; and
   the vertical channel layers are on at least one of the lower wiring pattern or the lower insulating layer.

8. The device as claimed in claim 1, wherein:
   the lower wiring pattern is a mesh pattern extending in the first direction and in a second direction intersecting the first direction, and
   an interval in the first direction of the lower wiring pattern is less than or equal to an interval in the second direction.

9. The device as claimed in claim 1, wherein:
   the lower wiring pattern includes an expansion part that extends outside the cell region; and
   an upper wiring layer including carbon is on the expansion part of the lower wiring pattern.

10. The device as claimed in claim 1, further comprising:
    a horizontal channel layer extending under the vertical channel layer in the horizontal
    direction, wherein:
    the lower wiring pattern is in contact with the horizontal channel layer;
    a gate dielectric layer is between each of the interlayer insulating layers and each of the plurality of vertical channel layers and between each of the plurality of gate electrodes and each of the plurality of vertical channel layers; and
    the gate dielectric layer extends between the horizontal channel layer and a bottom interlayer insulating layer in the horizontal direction and between the lower wiring pattern and the lower insulating layer in the vertical direction.

11. A vertical non-volatile memory device, comprising:
    a substrate;
    a lower insulating layer on the substrate;
    a plurality of vertical channel layers on the lower insulating layer, extending in a vertical direction with respect to a top surface of the substrate, and spaced apart from one another in a horizontal direction with respect to the top surface of the substrate;
    a plurality of gate electrodes on the lower insulating layer, stacked alternately with interlayer insulating layers in the vertical direction along a side wall of the vertical channel layers, and extending in a first direction along the horizontal direction;

a plurality of separation regions extending in the first direction and spaced apart in a second direction intersecting the first direction, the separation regions separating the gate electrodes from one another in the second direction;

a lower wiring pattern including first wiring lines extending under the separation regions in the first direction and connected to the substrate through the lower insulating layer; and a horizontal channel layer on the lower insulating layer and the lower wiring pattern and electrically connecting the vertical channel layers to the lower wiring pattern.

12. The device as claimed in claim 11, wherein:

the lower wiring pattern is a mesh pattern extending in the first direction and the second direction, and the lower wiring pattern includes second wiring lines spaced apart from one another in the first direction, extending in the second direction, and connected to the substrate through the lower insulating layer.

13. The device as claimed in claim 12, wherein the lower wiring pattern includes:

at least one third wiring line between the first wiring lines, extending in the first direction, and connected to the substrate through the lower insulating layer.

14. The device as claimed in claim 11, wherein at least one of the vertical channel layers is over the lower insulating layer.

15. The device as claimed in claim 11, wherein:

a gate dielectric layer is between each of the interlayer insulating layers and each of the vertical channel layers and between each of the gate electrodes and each of the vertical channel layers;

the gate dielectric layer extends between the horizontal channel layer and a bottom interlayer insulating layer in the horizontal direction; and the gate dielectric layer is between the horizontal channel layer and the lower insulating layer.

16. The device as claimed in claim 11, wherein:

the lower wiring pattern includes second wiring lines spaced apart from one another in the first direction, extending in the second direction, and connected to the substrate through the lower insulating layer; and the second wiring lines are in contact with the horizontal channel layer between the first wiring lines and are in contact with bottom surfaces of the separation regions at parts intersecting the first wiring lines.

17. The device as claimed in claim 11, further comprising:

an upper wiring layer including carbon on the first wiring lines, wherein the upper wiring layer has a width equal to or greater than a corresponding one of the first wiring lines in the second direction.

18. A vertical non-volatile memory device, comprising:

a substrate;

a plurality of vertical channels;

a vertical stack of gate electrodes and insulating layers; and a plurality of wiring patterns between the substrate and the vertical stack of gate electrodes and insulating layers, wherein the vertical channels are connected to the wiring patterns;

a horizontal channel between the plurality of vertical channels and the plurality of wiring patterns; and conductive layers connecting the horizontal channel to the plurality of wiring patterns.

19. The device as claimed in claim 18, further comprising:

a gate dielectric layer between the horizontal channel and the insulating layers, wherein the gate dielectric layer includes oxide-nitride-oxide (ONO).

20. The device as claimed in claim 18, wherein:

each of the wiring patterns has a first width, and each of the conductive layers has a second width different from the first width.

* * * * *